United States Patent
Yamaguchi et al.

(10) Patent No.: US 8,541,766 B2
(45) Date of Patent: Sep. 24, 2013

(54) NONVOLATILE MEMORY DEVICE AND NONVOLATILE MEMORY APPARATUS

(75) Inventors: Takeshi Yamaguchi, Kanagawa-ken (JP); Chikayoshi Kamata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 13/043,097

(22) Filed: Mar. 8, 2011

(65) Prior Publication Data

US 2011/0216575 A1    Sep. 8, 2011

Related U.S. Application Data

(63) Continuation of application No. PCT/JP2008/066193, filed on Sep. 8, 2008.

(51) Int. Cl.
*H01L 29/02* (2006.01)
*H01L 29/06* (2006.01)
*G11C 11/00* (2006.01)

(52) U.S. Cl.
USPC ..... 257/4; 257/2; 257/3; 257/5; 257/E29.002; 257/E29.005; 365/148

(58) Field of Classification Search
USPC ............ 365/148, 164; 257/2–5, E29.002, 257/E29.005, E29.006
See application file for complete search history.

(56) References Cited

U.S. PATENT DOCUMENTS

| 7,335,907 | B2 * | 2/2008 | Terao et al. ............ 257/2 |
| 7,719,082 | B2 * | 5/2010 | Aratani et al. ........ 257/529 |
| 7,733,684 | B2 * | 6/2010 | Kubo et al. ............ 365/148 |
| 8,389,968 | B2 * | 3/2013 | Sekine et al. .......... 257/2 |

| 2007/0196696 | A1 |  8/2007 | Osano et al. |
| 2007/0240995 | A1 | 10/2007 | Odagawa et al. |
| 2008/0164568 | A1 |  7/2008 | Lee et al. |
| 2010/0288995 | A1 * | 11/2010 | Ozawa et al. .......... 257/4 |

FOREIGN PATENT DOCUMENTS

| CN | 1898798 A | 1/2007 |
| CN | 1983619 A | 6/2007 |
| JP | 2006-80259 A | 3/2006 |
| JP | 2007-273548 A | 10/2007 |
| JP | 2007-288016 | 11/2007 |
| JP | 2008-84512 A | 4/2008 |
| WO | WO 2006/028117 A1 | 3/2006 |

OTHER PUBLICATIONS

U.S. Appl. No. 13/182,095, filed Jul. 13, 2011, Yamaguchi.
U.S. Appl. No. 12/884,880, filed Sep. 17, 2010, Kamata et al.
International Search Report issued Dec. 9, 2008, in PCT/JP08/066193, filed Sep. 8, 2008.
Written Opinion issued Sep. 12, 2008, in PCT/JP08/066193, filed Sep. 8, 2008.
Taiwanese Office Action issued Dec. 24, 2012, in Taiwan Patent Application No. 098128558 (with English translation).
Japanese Office Action issued on Jun. 7, 2013, in Japanese Patent Application No. 2010-527646 (with English Translation).

* cited by examiner

*Primary Examiner* — Allison P Bernstein
(74) *Attorney, Agent, or Firm* — Oblon, Spivak, McClelland, Maier & Neustadt, L.L.P.

(57) ABSTRACT

According to one embodiment, a nonvolatile memory device includes a recording layer and a conductive first layer. The recording layer includes a main group element, a transition element, and oxygen. The recording layer is capable of recording information by changing reversibly between a high resistance state and a low resistance state. The first layer is made of at least one selected from a metal, a metal oxide, a metal nitride, and a metal carbide. The first layer is provided adjacent to the recording layer. The first layer includes the main group element with a concentration lower than a concentration of the main group element of the recording layer.

26 Claims, 19 Drawing Sheets

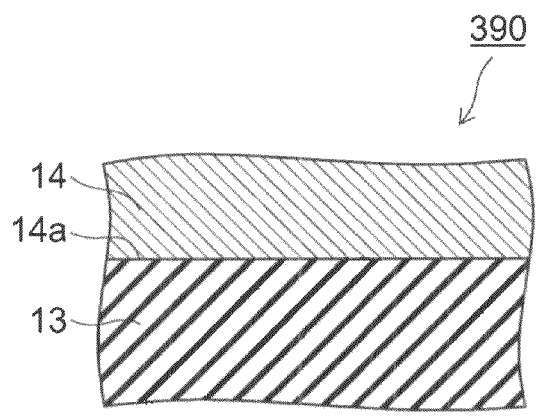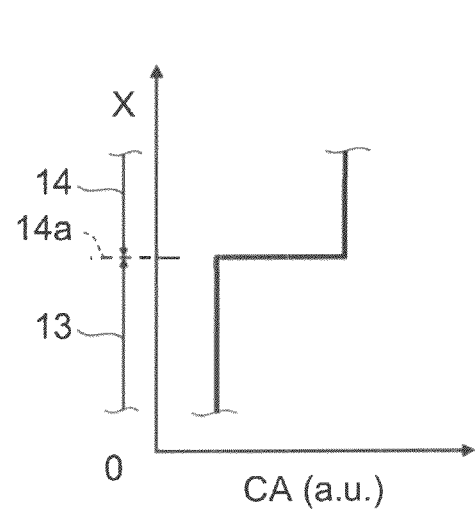
FIG. 3A　　　FIG. 3B
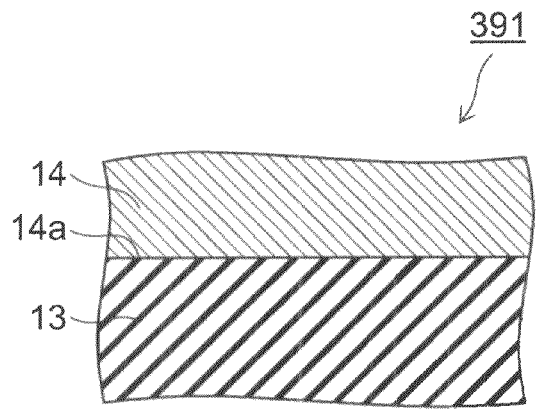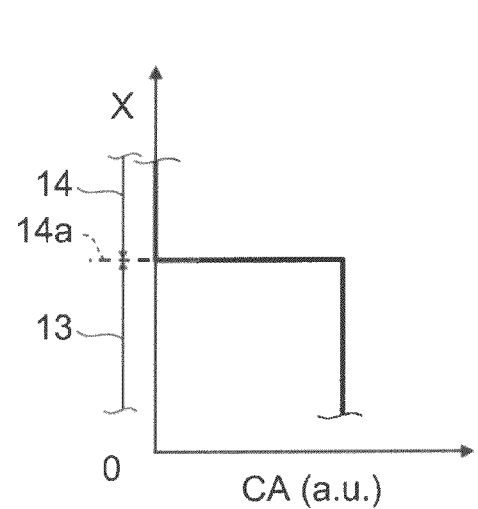
FIG. 4A　　　FIG. 4B

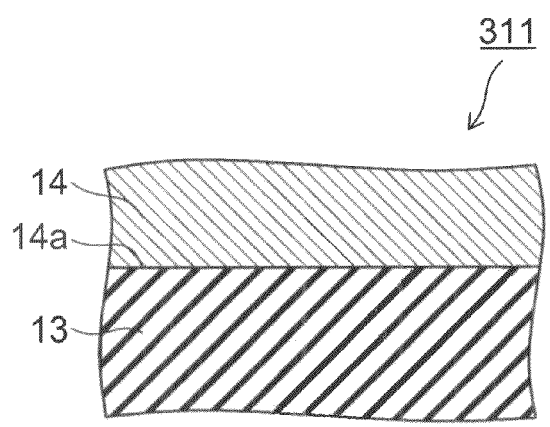
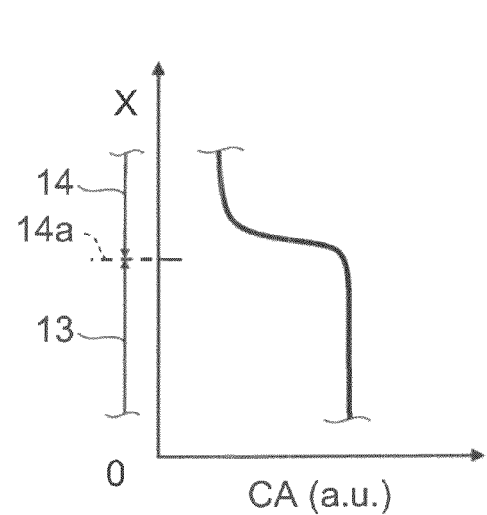
FIG. 5A    FIG. 5B
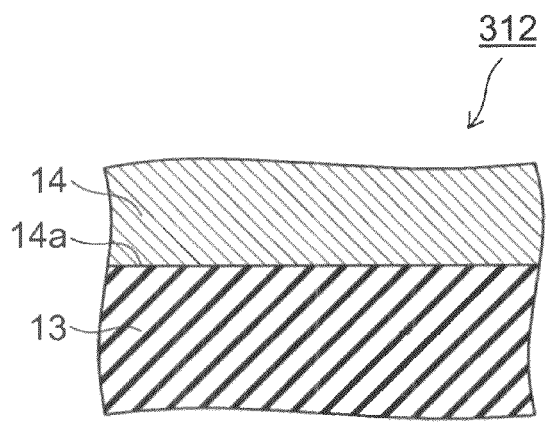
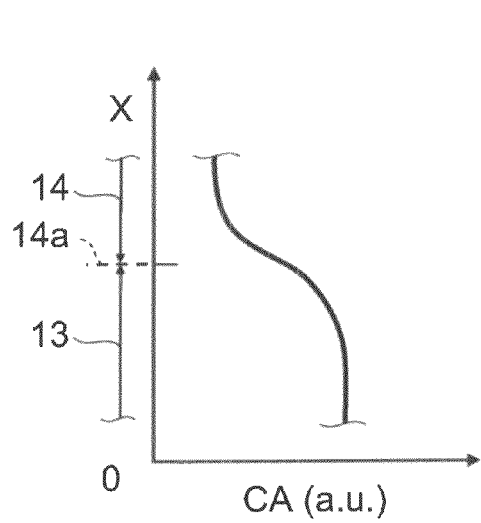
FIG. 6A    FIG. 6B

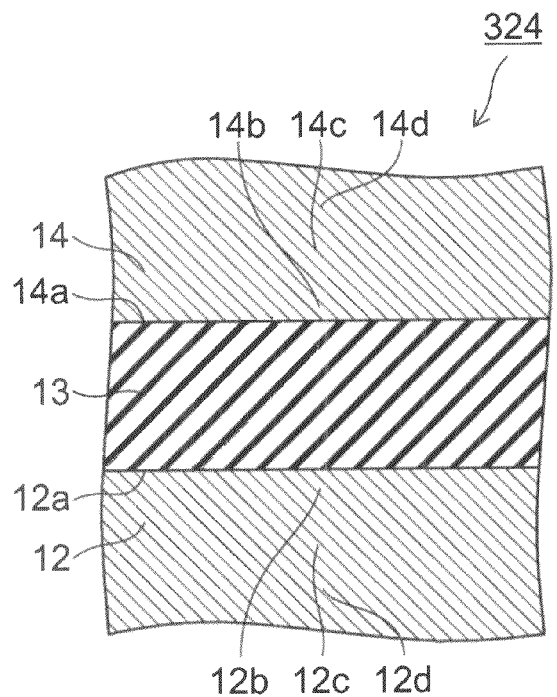
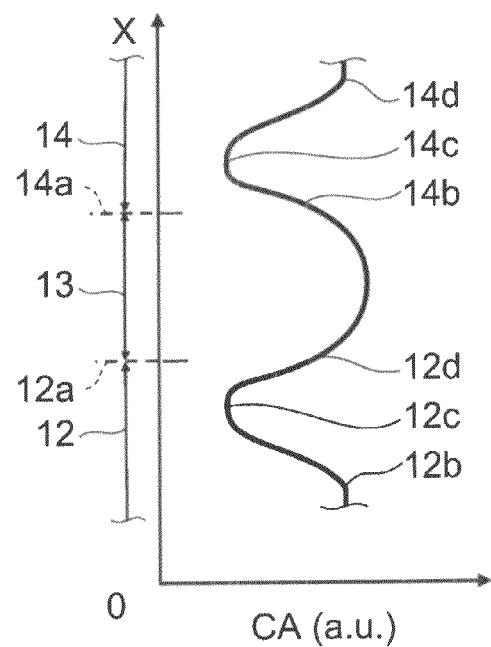
FIG. 13A    FIG. 13B
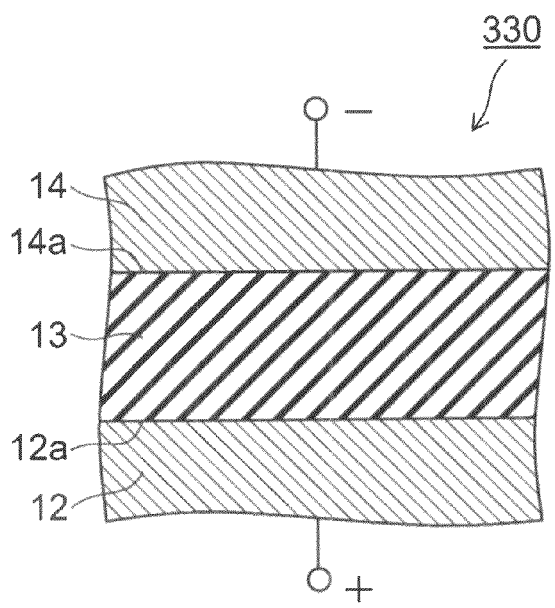
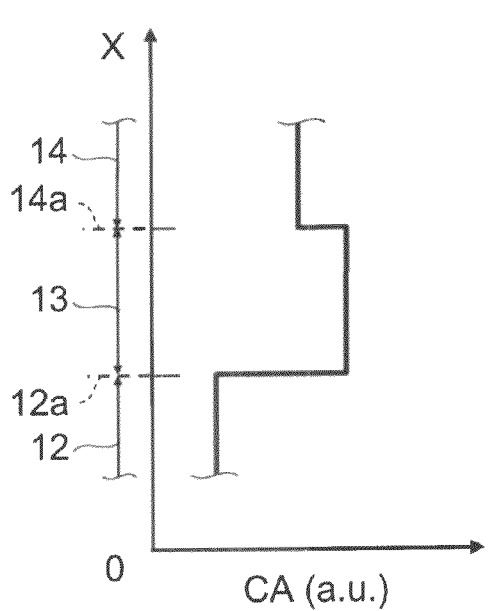
FIG. 14A    FIG. 14B

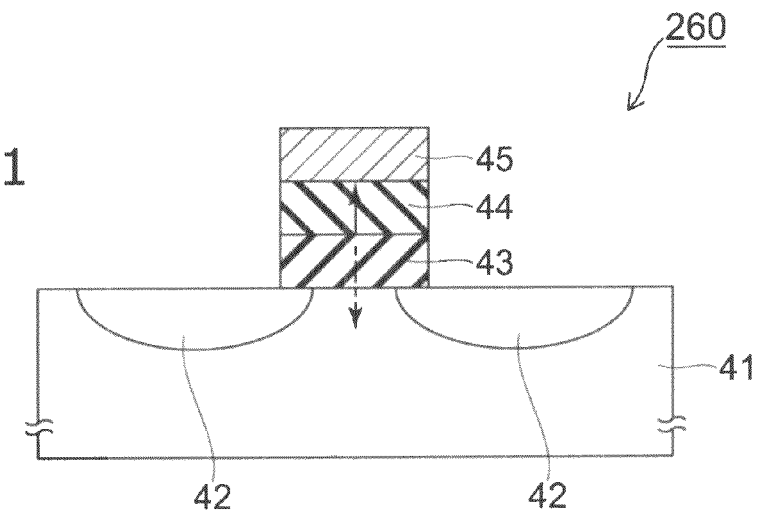
FIG. 21
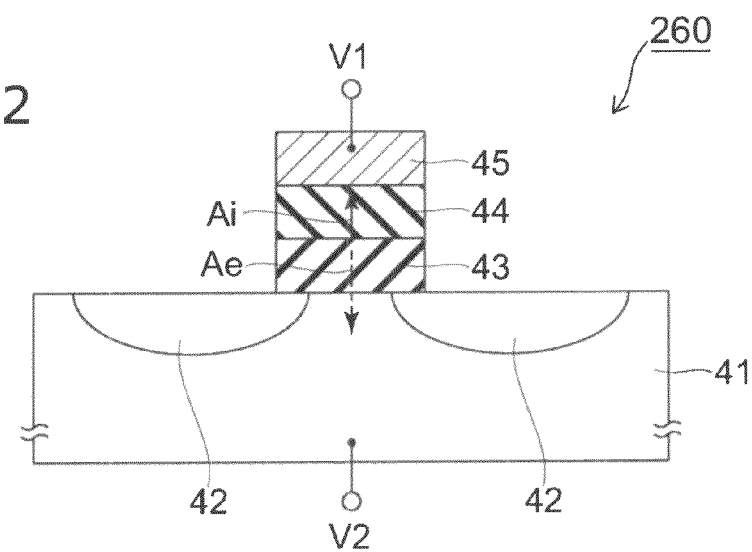
FIG. 22
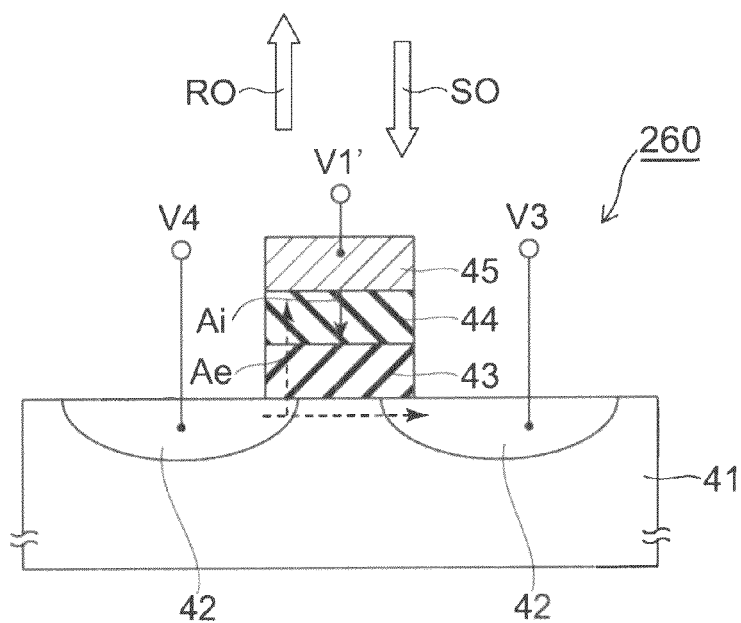

NONVOLATILE MEMORY DEVICE AND NONVOLATILE MEMORY APPARATUS

CROSS-REFERENCE TO RELATED APPLICATIONS

This is a continuation application of International Application PCT/JP2008/066193, filed on Sep. 8, 2008; the entire contents of which are incorporated herein by reference.

FIELD

Embodiments described herein relate generally to a nonvolatile memory device and a nonvolatile memory apparatus.

BACKGROUND

In recent years, downsized mobile devices have spread worldwide, and simultaneously, the demand for downsized large-capacity nonvolatile memory has rapidly increased with the drastic progress of high-speed telecommunications networks. Therein, NAND flash memory and downsized HDDs (hard disk drives) in particular have achieved rapid advancements of recording density to form a large market.

Under such circumstances, several ideas for new memory aiming to drastically exceed the limits of recording density have been proposed.

These include a memory using a resistance change material having a low resistance state and a high resistance state. The characteristics of the low resistance state and the high resistance state may fluctuate when repeatedly causing such a resistance change material to transition between the low resistance state and the high resistance state. Therefore, it is desirable to increase the repeated-operational stability.

JP-A 2007-288016 (Kokai) discusses technology in which a changeable resistance film is interposed between a lower metal electrode and an upper metal electrode; the changeable resistance film is doped with atoms included in the lower metal electrode and the upper metal electrode; and it is attempted to simplify a process called forming.

On the other hand, United States Patent Application Publication No. 2007/0240995 A1 discusses a configuration in which the resistance change layer includes $Fe_2O_3$ and $Fe_3O_4$; and the lower electrode has a composition which is different from that of the resistance change layer and is made of iron oxide including $Fe_3O_4$.

BRIEF DESCRIPTION OF THE DRAWINGS

FIGS. 3A and 3B are schematic views illustrating the configuration of a nonvolatile memory device of a first comparative example;

FIGS. 4A and 4B are schematic views illustrating the configuration of a nonvolatile memory device of a second comparative example;

FIGS. 5A and 5B are schematic views illustrating the configuration of another nonvolatile memory device according to the first embodiment;

FIGS. 6A and 6B are schematic views illustrating the configuration of another nonvolatile memory device according to the first embodiment;

FIGS. 13A and 13B are schematic views illustrating the configuration of another nonvolatile memory device according to the second embodiment;

FIGS. 14A and 14B are schematic views illustrating the configuration of a nonvolatile memory device according to a third embodiment;

FIG. 21 is a schematic cross-sectional view illustrating the configuration of the components of a nonvolatile memory apparatus according to a sixth embodiment;

FIG. 22 is a schematic cross-sectional view illustrating operations of the nonvolatile memory apparatus according to the sixth embodiment;

DETAILED DESCRIPTION

Figures 1A, 1B:
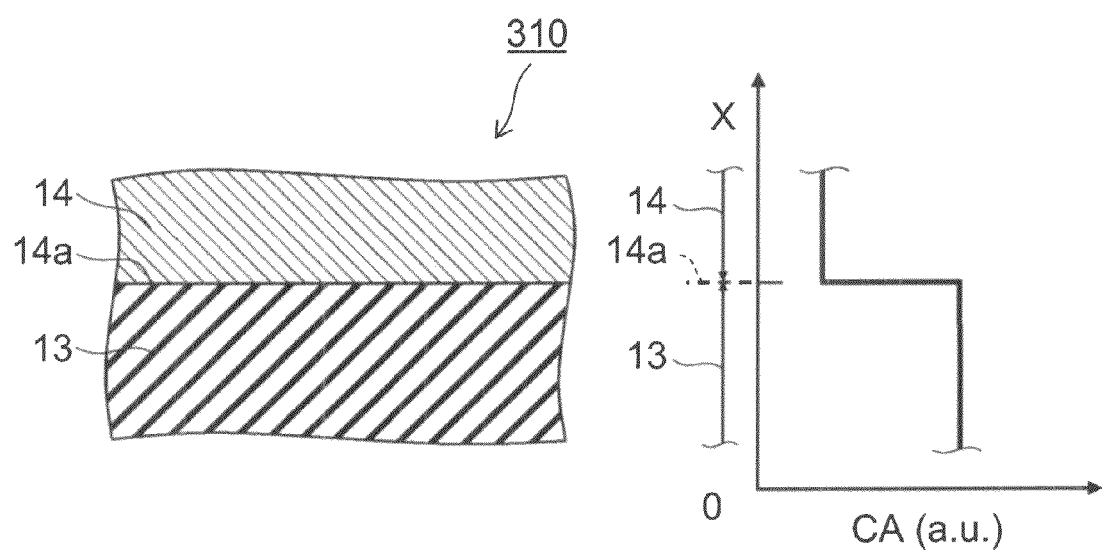
FIGS. 1A and 1B are schematic views illustrating the configuration of a nonvolatile memory device according to a first embodiment.

In general, according to one embodiment, a nonvolatile memory device includes a recording layer and a conductive first layer. The recording layer includes a main group element, a transition element, and oxygen. The recording layer is capable of recording information by changing reversibly between a high resistance state and a low resistance state. The first layer is made of at least one selected from a metal, a metal oxide, a metal nitride, and a metal carbide. The first layer is provided adjacent to the recording layer. The first layer includes the main group element with a concentration lower than a concentration of the main group element of the recording layer.

Embodiments will now be described in detail with reference to the drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIGS. 1A and 1B are schematic views illustrating the configuration of a nonvolatile memory device according to a first embodiment.

Namely, FIG. 1A is a schematic cross-sectional view illustrating the configuration of the nonvolatile memory device according to this embodiment. FIG. 1B is a graph illustrating the change of the concentrations of a main group element A of a recording layer 13 and an upper electrode 14 of the nonvolatile memory device according to this embodiment, in which the axis in the perpendicular direction illustrates the position x in the film thickness direction inside the recording layer 13 and the upper electrode 14, and the axis in the horizontal direction illustrates a concentration CA of the main group element A.

As illustrated in FIGS. 1A and 1B, the nonvolatile memory device 310 according to the first embodiment includes the recording layer 13 and the upper electrode 14 (the first layer).

The recording layer 13 is configured to undergo a phase change between a phase of the high resistance state and a phase of the low resistance state by a voltage being applied to the recording layer 13 or a current flowing through the recording layer 13. In other words, for example, the recording layer 13 is configured to have phases of multiple states having different resistivities by a potential difference being applied to the recording layer 13 via the upper electrode 14 or a current flowing in the recording layer 13 via the upper electrode 14.

The nonvolatile memory device 310 according to this embodiment can be applied to, for example, nonvolatile memory and the like such as cross-point nonvolatile memory, probe memory-type nonvolatile memory, and various flash memory-type nonvolatile memory. As one example, the configuration of the nonvolatile memory device 310 will now be described for the case where the nonvolatile memory device 310 is used in a cross-point nonvolatile memory apparatus.

Figure 2A:
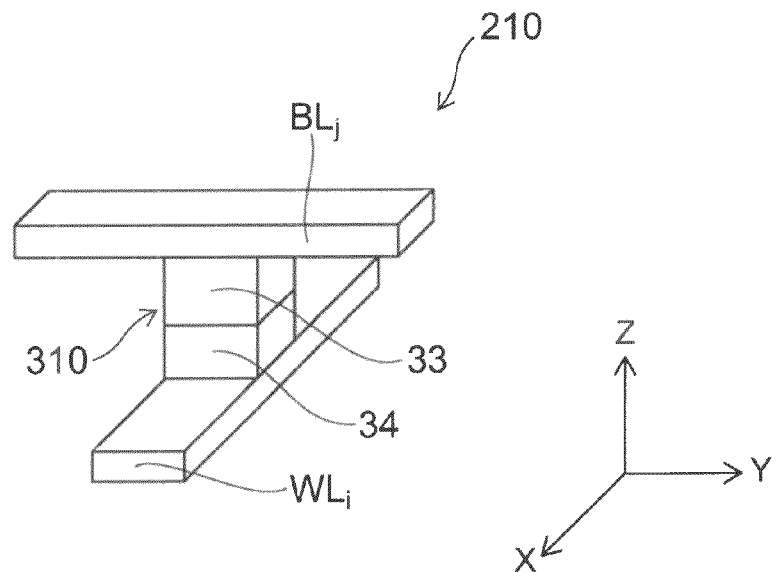
FIGS. 2A and 2B are schematic views illustrating the configuration of the components of a nonvolatile memory apparatus in which the nonvolatile memory device according to the first embodiment is applied.
Figure 2B:
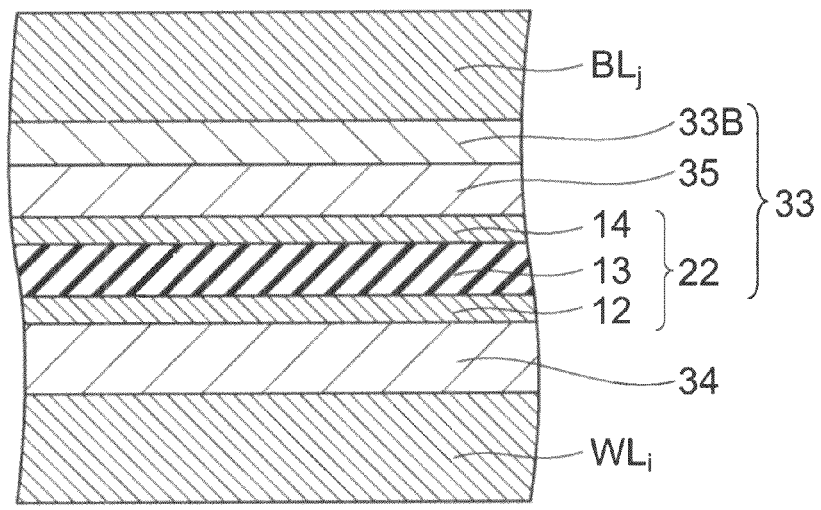

FIGS. 2A and 2B are schematic views illustrating the configuration of the components of the nonvolatile memory apparatus in which the nonvolatile memory device according to the first embodiment is applied.

Namely, FIG. 2A is a schematic perspective view; and FIG. 2B is a schematic cross-sectional view.

In the cross-point nonvolatile memory apparatus 210 as illustrated in FIGS. 2A and 2B, a memory cell 33 and a rectifying element 34 are provided between, for example, a word line $WL_i$ the and a bit line $BL_j$. The relationship of the vertical dispositions between the word line $WL_i$ and the bit line $BL_j$ is arbitrary. The relationship of the dispositions of the memory cell 33 and the rectifying element 34 between the word line $WL_i$ and the bit line $BL_j$ also is arbitrary. In other words, although the memory cell 33 is disposed on the bit line $BL_j$ side of the rectifying element 34 in the specific example illustrated in FIGS. 2A and 2B, the memory cell 33 may be disposed on the word line $WL_i$ side of the rectifying element 34.

As illustrated in FIGS. 2A and 2B, the memory cell 33 includes a recording unit 22. The recording unit 22 includes a lower electrode 12, the upper electrode 14, and the recording layer 13 provided between the lower electrode 12 and the upper electrode 14. Thus, the recording unit 22 of the memory cell 33 includes the nonvolatile memory device 310. The names of the upper electrode 14 and the lower electrode 12 are for convenience and are mutually interchangeable.

Other than the recording unit 22, the memory cell 33 may include a protective layer 33B and a heater layer 35 provided between the recording unit 22 and the protective layer 33B. Although the protective layer 33B is provided on the bit line $BL_j$ side of the recording unit 22 in this specific example, the protective layer 33B may be provided on the word line $WL_i$ side of the recording unit 22 and may be provided between the rectifying element 34 and the word line $WL_i$. Moreover, the heater layer 35 and the protective layer 33B are provided as necessary and may be omitted.

Each of the word line $WL_i$, the rectifying element 34, the memory cell 33, and the bit line $BL_j$ are multiply provided and are insulated from each other by an insulating layer provided therebetween.

At least one selected from the lower electrode 12 and the upper electrode 14 of the recording unit 22 may also be used as, for example, at least one selected from the word line $WL_i$, the rectifying element 34, the heater layer 35, the protective layer 33B, and the bit line $BL_j$ adjacent to the recording unit 22. In such a case, the layer that is also used as the at least one selected from the lower electrode 12 and the upper electrode 14 may be considered to be the at least one selected from the lower electrode 12 and the upper electrode 14.

Returning now to FIGS. 1A and 1B, the recording layer 13 and the upper electrode 14 are provided in the recording unit 22 of the nonvolatile memory device 310 according to this embodiment.

Although the lower electrode 12 can be provided as recited above, hereinbelow, first, to simplify the description, the case will be described where the nonvolatile memory device 310 includes the recording layer 13 and the upper electrode 14. Further, the lower electrode 12 may replace the upper electrode 14 in the description. In the nonvolatile memory device 310 according to this embodiment, the recording layer 13 includes the main group element A, a transition element B, and oxygen O. In other words, the recording layer 13 is represented by $A_xB_yO_z$ (where x is the molar ratio of the main group element, y is the molar ratio of the transition element, and z is the molar ratio of the oxygen O.

The recording layer 13 is capable of recording information by changing reversibly between the high resistance state and the low resistance state.

On the other hand, the first layer (the upper electrode 14) is provided adjacent to the recording layer 13. The upper electrode 14 is conductive and is made of at least one selected from a metal, a metal oxide, a metal nitride, and a metal carbide.

As illustrated in FIG. 1B, the upper electrode 14 includes the main group element A included in the recording layer 13. The concentration CA of the main group element A of the upper electrode 14 is lower than the concentration CA of the main group element A of the recording layer 13.

In the nonvolatile memory device 310 according to this embodiment, the recording layer 13 includes an oxide made of $A_xB_yO_z$; and the transition between the high resistance state and the low resistance state of the recording layer 13 is performed, for example, as follows.

For example, in the case where a voltage is applied to the recording layer 13, a portion of the main group element A included in the recording layer 13 moves toward, for example, the upper electrode 14.

The ions of the main group element A moving to the upper electrode 14 side receive electrons from the upper electrode 14 to form a metal layer by precipitating as a metal. Accordingly, the main group element is reduced and behaves metallically in a region close to the upper electrode 14; and the electrical resistance decreases.

On the other hand, in the interior of the recording layer 13, the number of positive ions of the interior of the recording layer 13 decreases relative to the oxygen ions because a portion of the main group element A has moved to the upper electrode 14 side. At this time, in the interior of the recording layer 13, as a result, the valence of the ions of the transition metal B remaining in the interior of the recording layer 13 increases. At this time, the electrical resistance decreases in the interiors of both the metal layer and the interior of the recording layer 13 when the transition metal B is selected such that the electrical resistance is reduced when the valence thereof is increased. Thus, the resistance value is reduced by the electric field being applied to the recording layer 13; and a low resistance phase LR is obtained. This operation is referred to as a set operation SO.

The reproduction of the recorded information is performed by, for example, applying a voltage pulse to the recording layer 13 and by detecting the resistance value of the recording layer 13. At this time, the voltage pulse has a value small enough that movement of the A ions does not occur.

On the other hand, the main group element A returns to the interior of the more thermally-stable recording layer 13 to switch to the initial high resistance phase HR when oxidation-reduction reaction of the recording layer 13 is promoted by, for example, applying a large current pulse to the recording layer 13 to heat the recording layer 13 by Joule heat. Also, the change can be made to the initial high resistance phase HR by reducing the valence of the portion of the ions of the transition element B which has the increased valence to the same initial value by applying a voltage pulse having a polarity opposite to that of the set operation SO to cause the main group element A close to the upper electrode 14 to provide electrons to the upper electrode 14 to become ions and subsequently return to the interior of the recording layer 13 due to the potential gradient inside the recording layer 13.

Thus, the nonvolatile memory apparatus 210 according to this embodiment performs recording operations, i.e., the set operation SO and a reset operation RO.

As described above, the upper electrode 14 includes the main group element A included in the recording layer 13. The concentration CA of the main group element A of the upper electrode 14 is lower than the concentration CA of the main group element A of the recording layer 13.

Thereby, the main group element A can move easily from the recording layer 13 to the upper electrode 14 side in the set operation SO recited above.

In other words, when the main group element A moves from the recording layer 13 in the direction of the upper electrode 14 in the set operation SO, the upper electrode 14 includes the main group element A which is the same type of element as the moving element. The concentration CA of the main group element A is lower in the upper electrode 14 than in the recording layer 13. Thereby, the main group element A can move easily from the recording layer 13 in the direction toward the upper electrode 14 in the set operation SO.

FIRST COMPARATIVE EXAMPLE

FIGS. 3A and 3B are schematic views illustrating the configuration of a nonvolatile memory device of a first comparative example.

Namely, FIG. 3A is a schematic cross-sectional view illustrating the configuration of the nonvolatile memory device 390 of the first comparative example. FIG. 3B is a graph illustrating the change of the concentrations of the main group element A of the recording layer 13 and the upper electrode 14 of the nonvolatile memory device 390 of the first comparative example in which the axis in the perpendicular direction illustrates the position x in the film thickness direction inside the recording layer 13 and the upper electrode 14, and the axis in the horizontal direction illustrates the concentration CA of the main group element A.

Although the main group element A is included in the upper electrode 14 of the nonvolatile memory device 390 of the first comparative example as illustrated in FIGS. 3A and 3B, the concentration CA thereof is higher in the upper electrode 14 than in the recording layer 13.

In the set operation SO in such a case, the main group element A does not move easily when moving from the recording layer 13 in the direction of the upper electrode 14 because the concentration of the main group element A, which is the same type of element as the moving element, is higher in the upper electrode 14 than in the recording layer 13. In other words, from the aspect of the concentration, the main group element A to be moved exists more stably in the recording layer 13. In other words, the aspect of the concentration of the main group element A acts in a direction contradicting the movement direction induced by the electric field. Accordingly, in the nonvolatile memory device 390 of this comparative example, it is difficult for the main group element A to move from the recording layer 13 in the direction toward the upper electrode 14 in the set operation SO; and the operations are unstable. The level of the instability of the operations increases in the case where the operations are repeated. In other words, the state of at least one selected from the low resistance phase LR and the high resistance phase HR undesirably fluctuates.

Conversely, in the nonvolatile memory device 310 according to this embodiment as described above, the main group element A moves easily from the recording layer 13 in the direction toward the upper electrode 14 in the set operation SO because the concentration CA of the main group element A is lower in the upper electrode 14 than in the recording layer 13; and the operations are stable even when repeated.

Thus, according to the nonvolatile memory device 310 according to this embodiment, a nonvolatile memory device having high repeated-operational stability can be provided.

SECOND COMPARATIVE EXAMPLE

FIGS. 4A and 4B are schematic views illustrating the configuration of a nonvolatile memory device of a second comparative example.

Namely, FIG. 4A is a schematic cross-sectional view illustrating the configuration of the nonvolatile memory device 391 of the second comparative example. FIG. 4B is a graph illustrating the change of the concentrations of the main group element A of the recording layer 13 and the upper electrode 14 of the nonvolatile memory device 391 of the second comparative example in which the axis in the perpendicular direction illustrates the position x in the film thickness direction inside the recording layer 13 and the upper electrode 14, and the axis in the horizontal direction illustrates the concentration CA of the main group element A.

As illustrated in FIGS. 4A and 4B, the main group element A included in the recording layer 13 is not included in the upper electrode 14 in the nonvolatile memory device 391 of the second comparative example.

When the main group element A moves from the recording layer 13 in the direction of the upper electrode 14 in the set operation SO of the nonvolatile memory device 391 having such a configuration, the resistance to the movement of the main group element A when moving through the upper electrode 14 is large because the main group element A is not included in the upper electrode 14. In other words, the energy of the main group element A existing inside the upper electrode 14 is high. As a result, it is difficult for the main group element A to move through the upper electrode 14.

Conversely, in the nonvolatile memory device 310 according to this embodiment as described above, the upper electrode 14 contains the main group element A with a concentration lower than the concentration of the recording layer 13. In other words, the upper electrode 14 already includes the main group element A with a low concentration. Therefore, the energy of the main group element A existing in the upper electrode 14 is low; and the main group element A can move easily through the upper electrode 14. Accordingly, according to the nonvolatile memory device 310 according to this embodiment, a nonvolatile memory device having high repeated-operational stability can be provided.

The technology discussed in JP-A 2007-288016 (Kokai) has a configuration in which a changeable resistance film is interposed between a lower metal electrode and an upper metal electrode; and the changeable resistance film is doped with the atoms included in the lower metal electrode and the upper metal electrode. Therefore, as in the nonvolatile memory device 310 according to this embodiment, the main group element A included in the recording layer 13 is not included in the upper electrode 14 with a low concentration; and the atoms included in the metal electrode are included in the recording layer 13. In other words, the concentration of the atoms included in the metal electrode is higher in the metal electrode than in the changeable resistance film.

The technology discussed in United States Patent Application Publication No. 2007/0240995A1 has a configuration in which the resistance change layer includes $Fe_2O_3$ and $Fe_3O_4$; and the lower electrode has a composition different from that of the resistance change layer and is made of iron oxide including $Fe_3O_4$. Therefore, the resistance change layer is not made of a main group element, a transition element, and oxygen. Further, even in the case where the Fe of this configuration is considered to be the main group element A of this embodiment, the Fe concentration of the lower electrode is higher than the Fe concentration of the resistance change layer.

Thus, the configurations discussed in JP-A 2007-288016 (Kokai) and United States Patent Application Publication No. 2007/0240995A1 do not enable the easy movement of the main group element A included in the recording layer 13 as described in the first comparative example.

FIGS. 5A and 5B are schematic views illustrating the configuration of another nonvolatile memory device according to the first embodiment.

Namely, FIG. 5A is a schematic cross-sectional view illustrating the configuration of the nonvolatile memory device 311 according to this embodiment. FIG. 5B is a graph illustrating the change of the concentrations of the main group element A of the recording layer 13 and the upper electrode 14 of the nonvolatile memory device 311 according to this embodiment in which the axis in the perpendicular direction illustrates the position x in the film thickness direction inside the recording layer 13 and the upper electrode 14, and the axis in the horizontal direction illustrates the concentration CA of the main group element A.

As illustrated in FIGS. 5A and 5B, the concentration CA of the main group element of the upper electrode 14 changes gradually in the nonvolatile memory device 311 according to the first embodiment. Otherwise, the nonvolatile memory device 311 may be similar to the nonvolatile memory device 310, and a description is omitted.

In the nonvolatile memory device 311 according to this embodiment, the region of the upper electrode 14 close to a first interface 14a between the recording layer 13 and the upper electrode 14 has a concentration CA of the main group element A higher than that of the region of the upper electrode 14 far to the first interface 14a. For example, the concentration CA of the main group element A changes continuously through the upper electrode 14 away from the first interface 14a. In other words, the concentration CA gradually decreases.

Thus, because the concentration CA of the main group element A has a concentration gradient in the upper electrode 14 of the nonvolatile memory device 311 according to this embodiment, the main group element A moves easily from the recording layer 13 toward the upper electrode 14 and from the first interface 14a into the upper electrode 14.

Thereby, according to the nonvolatile memory device 311 according to this embodiment, a nonvolatile memory device having higher repeated-operational stability can be provided.

FIGS. 6A and 6B are schematic views illustrating the configuration of another nonvolatile memory device according to the first embodiment.

Namely, FIG. 6A is a schematic cross-sectional view illustrating the configuration of the nonvolatile memory device 312 according to this embodiment. FIG. 6B is a graph illustrating the change of the concentrations of the main group element A of the recording layer 13 and the upper electrode 14 of the nonvolatile memory device 312 according to this embodiment in which the axis in the perpendicular direction illustrates the position x in the film thickness direction inside the recording layer 13 and the upper electrode 14, and the axis in the horizontal direction illustrates the concentration CA of the main group element A.

In the nonvolatile memory device 312 according to the first embodiment as illustrated in FIGS. 6A and 6B, the concentration CA of the main group element of the recording layer 13 changes gradually. Otherwise, the nonvolatile memory device 312 may be similar to the nonvolatile memory device 311, and a description is omitted.

In other words, other than the concentration CA of the main group element A having the concentration gradient in the upper electrode 14 of the nonvolatile memory device 312 according to this embodiment, the concentration CA of the main group element A has a concentration gradient in the recording layer 13.

In other words, in the recording layer 13, the concentration of the main group element A in a region close to the first interface 14a between the recording layer 13 and the upper electrode 14 is lower than that of a region far to the first interface 14a. In other words, the concentration of the main group element A is highest at a portion of the recording layer 13 far to the first interface 14a and decreases therefrom toward a portion of the recording layer 13 close to the first interface 14a.

The concentration of the main group element A is low at a portion of the upper electrode 14 close to the first interface 14a and lowest at a portion of the upper electrode 14 far to the first interface 14a.

The concentration CA changes continuously in each of the portions recited above.

Thus, in the nonvolatile memory device 312 according to this embodiment, the main group element A moves easily from the recording layer 13 toward the upper electrode 14 and from the first interface 14a into the upper electrode 14 because the concentration CA of the main group element A has a concentration gradient in the recording layer 13 and the upper electrode 14 from the recording layer 13 toward the upper electrode 14 and from the first interface 14a into the upper electrode 14.

Thereby, according to the nonvolatile memory device 312 according to this embodiment, a nonvolatile memory device having higher repeated-operational stability can be provided.

Figures 7A, 7B:
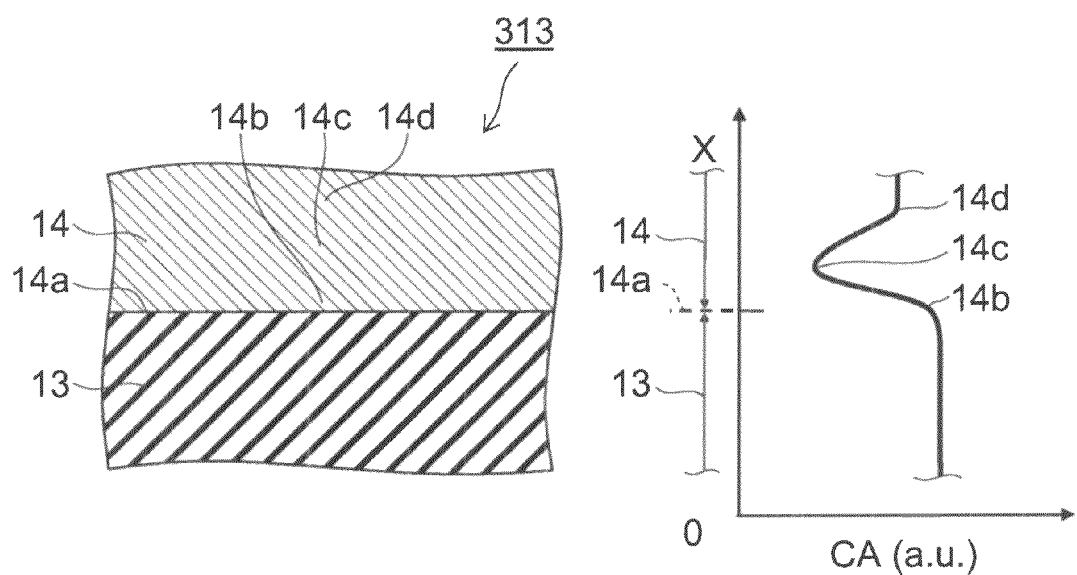
FIGS. 7A and 7B are schematic views illustrating the configuration of another nonvolatile memory device according to the first embodiment.

FIGS. 7A and 7B are schematic views illustrating the configuration of another nonvolatile memory device according to the first embodiment.

Namely FIG. 7A is a schematic cross-sectional view illustrating the configuration of the nonvolatile memory device 313 according to this embodiment. FIG. 7B is a graph illustrating the change of the concentrations of the main group element A of the recording layer 13 and the upper electrode 14 of the nonvolatile memory device 313 according to this embodiment in which the axis in the perpendicular direction illustrates the position x in the film thickness direction inside the recording layer 13 and the upper electrode 14, and the axis in the horizontal direction illustrates the concentration CA of the main group element A.

In the nonvolatile memory device 313 according to the first embodiment as illustrated in FIGS. 7A and 7B, the concentration CA of the main group element of the upper electrode 14 decreases once from the first interface 14a toward the upper electrode 14 and then increases. Otherwise, the nonvolatile memory device 313 may be similar to the nonvolatile memory device 311, and a description is omitted.

In the upper electrode 14 of the nonvolatile memory device 313 according to this embodiment, the concentration CA of the main group element A is higher in a close region 14b close to the first interface 14a between the recording layer 13 and the upper electrode 14 than in an intermediate region 14c far to the first interface 14a; and a far region 14d farther to the first interface 14a than is the intermediate region 14c has a concentration CA of the main group element A higher than that of the intermediate region 14c.

This embodiment realizes the effect of increasing the repeated-operational stability by enabling the main group element A to move easily from the recording layer 13 toward the upper electrode 14. Therefore, in the upper electrode 14 as in the nonvolatile memory device 313 according to this embodiment, it is sufficient for the concentration CA of the main group element A in a portion of the close region 14b close to the first interface 14a between the recording layer 13 and the upper electrode 14 to be higher than in a region far to the first interface 14a, that is, the intermediate region 14c in this case; and the concentration CA may increase again in the far region 14d beyond the intermediate region 14c.

According to the nonvolatile memory device according to this embodiment as well, a nonvolatile memory device having higher repeated-operational stability can be provided.

Figures 8A, 8B:
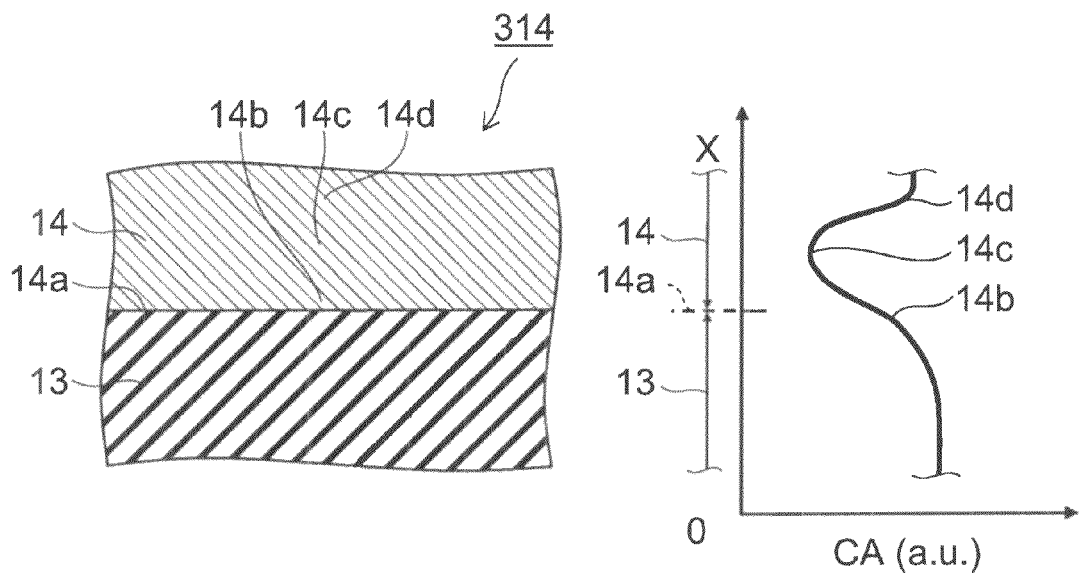
FIGS. 8A and 8B are schematic views illustrating the configuration of another nonvolatile memory device according to the first embodiment.

FIGS. 8A and 8B are schematic views illustrating the configuration of another nonvolatile memory device according to the first embodiment.

Namely, FIG. 8A is a schematic cross-sectional view illustrating the configuration of the nonvolatile memory device 314 according to this embodiment. FIG. 8B is a graph illustrating the change of the concentrations of the main group element A of the recording layer 13 and the upper electrode 14 of the nonvolatile memory device 314 according to this embodiment in which the axis in the perpendicular direction illustrates the position x in the film thickness direction inside the recording layer 13 and the upper electrode 14, and the axis in the horizontal direction illustrates the concentration CA of the main group element A.

In the nonvolatile memory device 314 according to the first embodiment as illustrated in FIGS. 8A and 8B, the concentration CA of the main group element of the recording layer 13 changes gradually. Otherwise, the nonvolatile memory device 314 may be similar to the nonvolatile memory device 313, and a description is omitted.

In other words, in the nonvolatile memory device 314 according to this embodiment, the concentration CA of the main group element A has a concentration gradient in the recording layer 13. In the upper electrode 14, the concentration CA of the main group element A is higher in the close region 14b close to the first interface 14a between the recording layer 13 and the upper electrode 14 than in the intermediate region 14c far to the first interface 14a; and the far region 14d farther to the first interface 14a than is the intermediate region 14c has a concentration CA of the main group element A higher than that of the intermediate region 14c.

In other words, in the recording layer 13, the concentration of the main group element A is lower in the region close to the first interface 14a between the recording layer 13 and the upper electrode 14 than in the region far to the first interface 14a. In other words, the concentration of the main group element A is highest in a portion of the recording layer 13 far to the first interface 14a and decreases therefrom toward a portion of the recording layer 13 close to the first interface 14a.

The concentration CA of the main group element of the upper electrode 14 decreases once from the first interface 14a toward the upper electrode 14 and then increases.

The concentration CA changes continuously in each of the portions recited above.

Thus, in the nonvolatile memory device 314 according to this embodiment, the main group element A moves easily from the recording layer 13 toward the upper electrode 14 and from the first interface 14a into the upper electrode 14 because the concentration CA of the main group element A has a concentration gradient in the recording layer 13 and the upper electrode 14 from the recording layer 13 toward the upper electrode 14.

In the upper electrode 14 as in the nonvolatile memory device 314 according to this embodiment, it is sufficient for the concentration CA of the main group element A to be higher in a portion of the close region 14b close to the first interface 14a between the recording layer 13 and the upper electrode 14 than in a region far to the first interface 14a, that is, the intermediate region 14c in this case; and the concentration CA may increase again in the far region 14d beyond the intermediate region 14c.

Thereby, according to the nonvolatile memory device 314 according to this embodiment as well, a nonvolatile memory device having higher repeated-operational stability can be provided.

In the nonvolatile memory devices 310 to 314 according to this embodiment, any method may be used to cause the main group element A included in the recording layer 13 to be contained in the upper electrode 14 with a concentration lower than the concentration of the recording layer 13.

For example, a method may be employed in which the film used to form the recording layer 13 is formed; and subsequently, a target, which includes at least one selected from a metal, a metal oxide, a metal nitride, and a metal carbide used to form the upper electrode 14, also includes the main group element A included in the recording layer 13 and is used to form the film used to form the upper electrode 14. For example, the nonvolatile memory device 310 can be constructed using such a method.

Also, a method may be employed in which the recording layer 13 is formed; then, the film used to form the upper electrode 14 is formed using a target that includes at least one selected from a metal, a metal oxide, a metal nitride, and a metal carbide used to form the upper electrode 14; and subsequently, the main group element contained in the film used to form the recording layer 13 is diffused from the film used to form the recording layer 13 into the film used to form the upper electrode 14 by heating the film used to form the recording layer 13 and the film used to form the upper electrode 14.

As recited above, the order of the formation of the film used to form the recording layer 14 and the formation of the film used to form the upper electrode 14 is arbitrary.

The characteristic in which the concentration CA of the main group element A from the first interface 14a in the upper electrode 14 decreases once away from the first interface 14a and then increases again as in the nonvolatile memory devices 313 and 314 can be obtained in the case where, for example, as described above, a film used to form at least one selected from the word line the rectifying element 34, the heater layer 35, the protective layer 33B, and the bit line $BL_j$ is formed on the film used to form the recording layer 13 and the film used to form the upper electrode 14 (on the face of the upper electrode 14 on the side opposite to the recording layer 13) and this film contains the main group element A included in the recording layer 13.

Second Embodiment

Figures 9A, 9B:
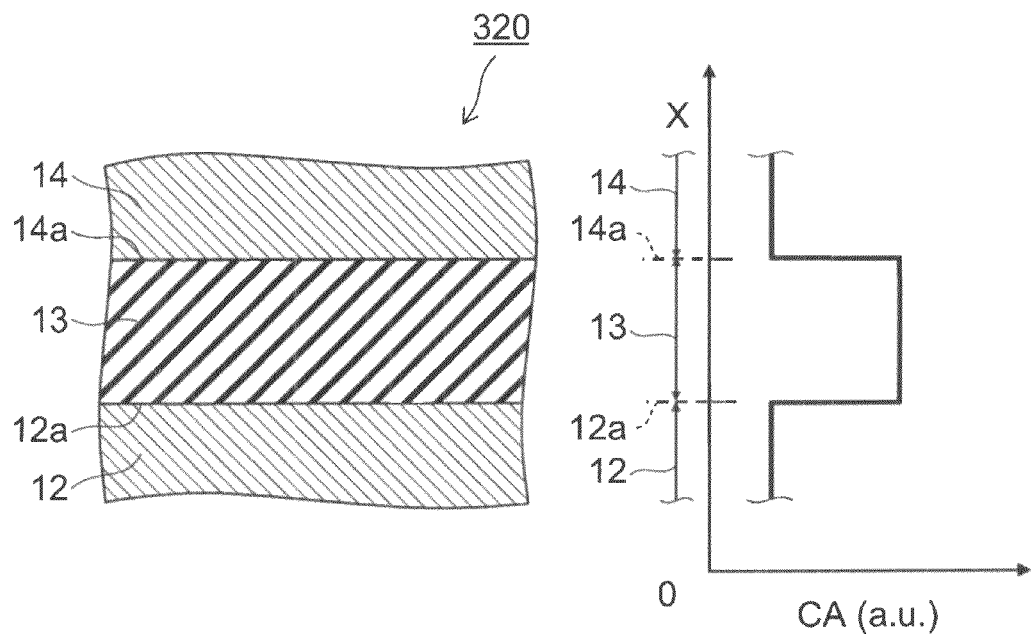
FIGS. 9A and 9B are schematic views illustrating the configuration of a nonvolatile memory device according to a second embodiment.

FIGS. 9A and 9B are schematic views illustrating the configuration of a nonvolatile memory device according to a second embodiment.

Namely, FIG. 9A is a schematic cross-sectional view illustrating the configuration of the nonvolatile memory device 320 according to this embodiment. FIG. 9B is a graph illustrating the change of the concentrations of the main group element A of the lower electrode 12, the recording layer 13, and the upper electrode 14 of the nonvolatile memory device 320 according to this embodiment in which the axis in the perpendicular direction illustrates the position x in the film thickness direction inside the lower electrode 12, the recording layer 13, and the upper electrode 14, and the axis in the horizontal direction illustrates the concentration CA of the main group element A.

As illustrated in FIGS. 9A and 9B, the nonvolatile memory device 320 according to the second embodiment includes the recording layer 13, the upper electrode 14 (the first layer), and the lower electrode 12 (the second layer).

The upper electrode 14 includes the main group element A included in the recording layer 13. The concentration CA of the main group element A of the upper electrode 14 is lower than the concentration CA of the main group element A of the recording layer 13.

The lower electrode 12 is made of at least one selected from a metal, a metal oxide, a metal nitride, and a metal carbide and includes the main group element A included in the recording layer 13. The concentration CA of the main group element A of the lower electrode 12 is lower than the concentration CA of the main group element A of the recording layer 13.

In other words, the nonvolatile memory device 320 further includes the lower electrode 12 provided adjacent to the recording layer 13 on the side opposite to the upper electrode 14 of the nonvolatile memory device 310 described above, where the lower electrode 12 is made of at least one selected from a metal, a metal oxide, a metal nitride, and a metal carbide and includes the main group element A with a concentration lower than the concentration of the main group element A of the recording layer 13.

Thereby, due to effects similar to those described in regard to the first embodiment, the main group element A moves easily from the recording layer 13 where it originates toward the upper electrode 14 or the lower electrode 12 in the case where the polarity of the voltage applied to the upper electrode 14 and the lower electrode 12 is inverted or in the case where the orientation of the current flowing between the upper electrode 14 and the lower electrode 12 is inverted.

In other words, by enabling the main group element A to move easily when applying voltages having different polarities to the recording layer 13 or providing currents having different directions to the recording layer 13, operations of both of the polarities can be stabilized.

In the nonvolatile memory device 320 according to this embodiment as well, various variations similar to those of the nonvolatile memory device 310 according to the first embodiment are possible.

FIGS. 10A to 13B are schematic views illustrating the configuration of other nonvolatile memory devices according to the second embodiment.

Namely, FIGS. 10A, 11A, 12A, and 13A are schematic cross-sectional views illustrating the configurations of the nonvolatile memory devices 321 to 324 according to this embodiment respectively. FIGS. 10B, 11B, 12B, and 13B are graphs illustrating the change of the concentrations of the main group element A of the lower electrode 12, the recording layer 13, and the upper electrode 14 of the nonvolatile memory devices 321 to 324 according to this embodiment respectively in which the axis in the perpendicular direction illustrates the position x in the film thickness direction inside the lower electrode 12, the recording layer 13, and the upper electrode 14, and the axis in the horizontal direction illustrates the concentration CA of the main group element A.

The characteristics of the upper electrode 14 and the recording layer 13 of FIG. 10A to FIG. 13B have been described in the first embodiment, and descriptions are therefore omitted as appropriate.

Figures 10A, 10B:
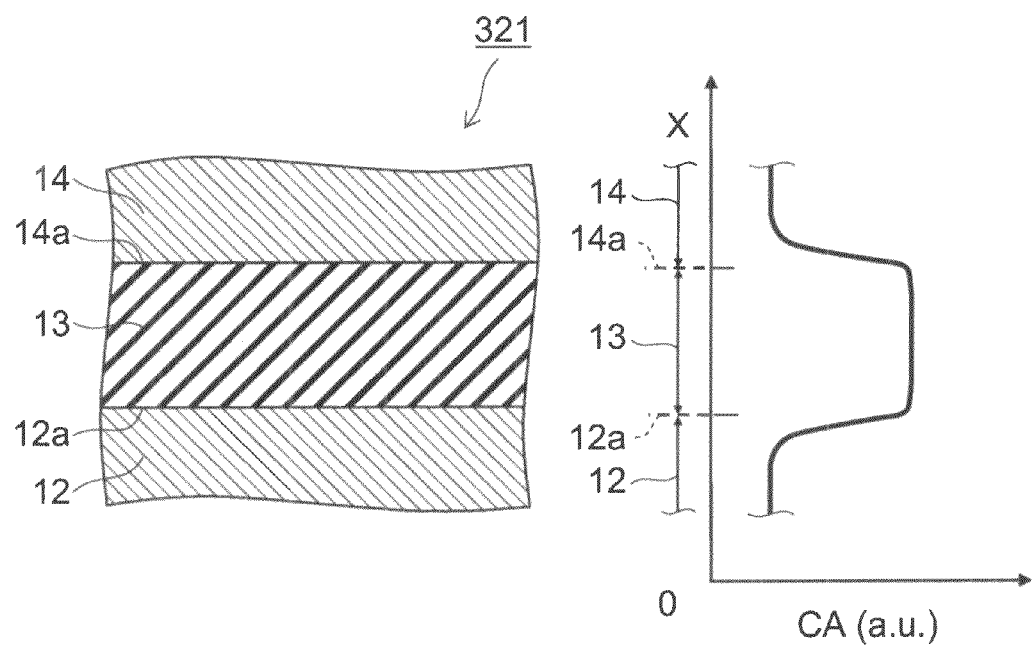
FIGS. 10A and 10B are schematic views illustrating the configuration of another nonvolatile memory device according to the second embodiment.

In the nonvolatile memory device 321 according to the second embodiment as illustrated in FIGS. 10A and 10B, the concentration CA of the main group element of the upper electrode 14 and the lower electrode 12 changes gradually. Otherwise, the nonvolatile memory device 321 may be similar to the nonvolatile memory device 320, and a description is omitted.

In the upper electrode 14 of the nonvolatile memory device 321 according to this embodiment, the concentration CA of the main group element A is higher in a region close to the first interface 14a between the recording layer 13 and the upper electrode 14 than in a region far to the first interface 14a; and in the lower electrode 12, the concentration CA of the main group element A is higher in a region close to a second interface 12a between the recording layer 13 and the lower electrode 12 than in a region far to the second interface 12a.

Thus, in the nonvolatile memory device 321 according to this embodiment, the main group element A moves easily from the recording layer 13 toward the upper electrode 14 and from the first interface 14a into the upper electrode 14, or the main group element A moves easily from the recording layer 13 toward the lower electrode 12 and from the second interface 12a into the lower electrode 12 because the concentration CA of the main group element A has a concentration gradient in the upper electrode 14 and the lower electrode 12.

Thereby, according to the nonvolatile memory device 321 according to this embodiment, a nonvolatile memory device having high repeated-operational stability can be provided.

Figure 11A:
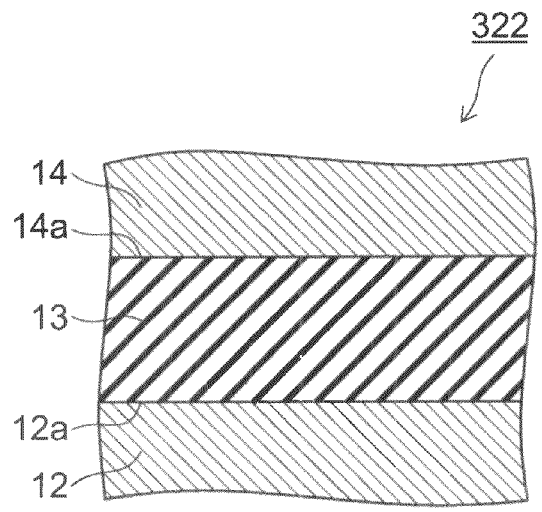
FIGS. 11A and 11B are schematic views illustrating the configuration of another nonvolatile memory device according to the second embodiment.
Figure 11B:
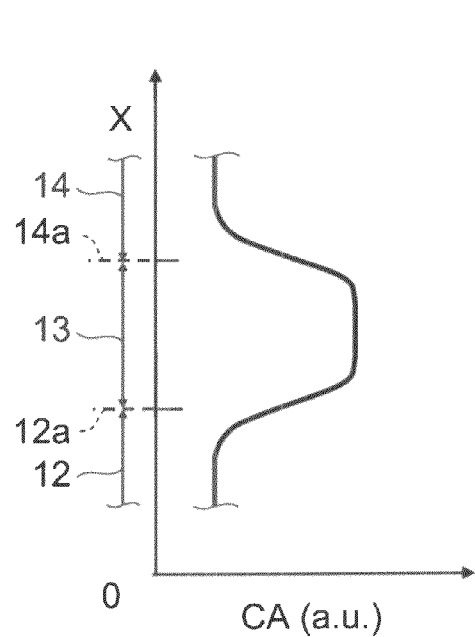

In the nonvolatile memory device 322 according to this embodiment as illustrated in FIGS. 11A and 11B, the concentration CA of the main group element of the recording layer 13 close to the first interface 14a and the second interface 12a changes gradually.

In other words, in the recording layer 13, the concentration CA of the main group element is lower in a region close to the first interface 14a between the recording layer 13 and the upper electrode 14 than in a region far to the first interface 14a and is lower in a region close to the second interface 12a between the recording layer 13 and the lower electrode 12 than in a region far to the second interface 12a.

In the upper electrode 14, the concentration CA is lower in a portion of the upper electrode 14 close to the first interface 14a and lowest in a portion of the upper electrode 14 far to the first interface 14a. In the lower electrode 12, the concentration CA is lower in a region close to the second interface 12a between the recording layer 13 and the lower electrode 12 than in a region far to the second interface 12a.

The concentration CA changes continuously in each of the portions recited above.

Thus, in the nonvolatile memory device 322 according to this embodiment, the main group element A moves easily from the recording layer 13 toward the upper electrode 14 and from the first interface 14a into the upper electrode 14, or the main group element A moves easily from the recording layer 13 toward the lower electrode 12 and from the second interface 12a into the lower electrode 12 because the concentration CA of the main group element A has a concentration gradient in the lower electrode 12, the recording layer 13, and the upper electrode 14 from the recording layer 13 toward the upper electrode 14 and from the recording layer 13 toward the lower electrode 12.

Thereby, according to the nonvolatile memory device 322 according to this embodiment, a nonvolatile memory device having higher repeated-operational stability can be provided.

Figure 12A:
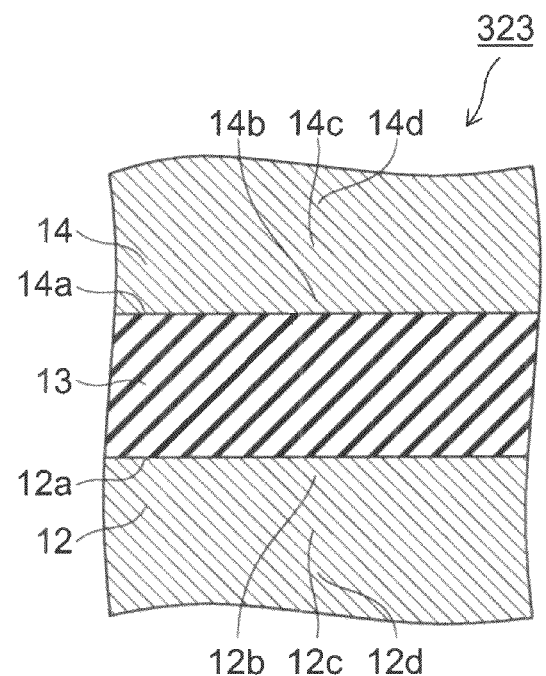
FIGS. 12A and 12B are schematic views illustrating the configuration of another nonvolatile memory device according to the second embodiment.
Figure 12B:
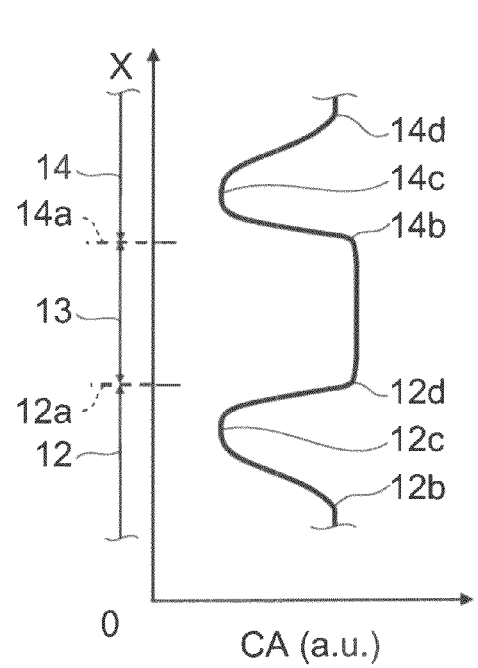

In the nonvolatile memory device 323 according to this embodiment as illustrated in FIGS. 12A and 12B, the concentration CA of the main group element of the upper electrode 14 decreases once from the first interface 14a toward the upper electrode 14 and then increases; and the concentration CA of the main group element of the lower electrode 12 decreases once from the second interface 12a toward the lower electrode 12 and then increases.

Thus, in the upper electrode 14, it is sufficient for the concentration CA of the main group element A to be higher in a portion of the close region 14b close to the first interface 14a between the recording layer 13 and the upper electrode 14 than in a region far to the first interface 14a, that is, the intermediate region 14c in this case; and the concentration CA may increase again in the far region 14d beyond the intermediate region 14c. In the lower electrode 12, it is sufficient for the concentration CA of the main group element A to be higher in a portion of a close region 12b close to the second interface 12a between the recording layer 13 and the lower electrode 12 than in a region far to the second interface 12a, that is, an intermediate region 12c in this case; and the concentration CA may increase again in a far region 12d beyond the intermediate region 12c.

According to the nonvolatile memory device 323 according to this embodiment as well, a nonvolatile memory device having higher repeated-operational stability can be provided.

In the nonvolatile memory device 324 according to this embodiment as illustrated in FIGS. 13A and 13B, the concentration CA of the main group element of the recording layer 13 changes gradually; the concentration CA of the main group element of the upper electrode 14 decreases once from the first interface 14a toward the upper electrode 14 and then increases; and the concentration CA of the main group element of the lower electrode 12 decreases once from the second interface 12a toward the lower electrode 12 and then increases.

Thus, in the nonvolatile memory device 324 according to this embodiment, the main group element A moves easily from the recording layer 13 toward the upper electrode 14 and from the first interface 14a into the upper electrode 14 because the concentration CA of the main group element A has a concentration gradient in the recording layer 13 and the upper electrode 14 from the recording layer 13 toward the upper electrode 14. The main group element A moves easily from the recording layer 13 toward the lower electrode 12 and from the second interface 12a into the lower electrode 12 because the concentration CA of the main group element A has a concentration gradient in the recording layer 13 and the lower electrode 12 from the recording layer 13 toward the lower electrode 12.

Thereby, according to the nonvolatile memory device 324 according to this embodiment as well, a nonvolatile memory device having higher repeated-operational stability can be provided.

Thus, according to the nonvolatile memory apparatuses 320 to 324 according to this embodiment, the main group element A moves easily from the recording layer 13 where it originates toward the upper electrode 14 or the lower electrode 12 in the case where the polarity of the voltage applied to the upper electrode 14 and the lower electrode 12 is inverted or in the case where the orientation of the current flowing between the upper electrode 14 and the lower electrode 12 is inverted. By enabling the main group element A to move easily when applying voltages having different polarities to the recording layer 13 or providing currents having different directions to the recording layer 13, the operations of both of the polarities can be stabilized.

In other words, the operations can be stabilized when employing a method in which the pulse applied in the reset operation RO has a polarity opposite to that of the set operation SO, i.e., when driving with both polarities.

The nonvolatile memory apparatuses 320 to 324 according to this embodiment may be driven by a single polarity. In such a case as well, a nonvolatile memory device having higher repeated-operational stability can be provided.

Although the case is described in the nonvolatile memory devices 320 to 324 recited above where the characteristic of the recording layer 13 on the upper electrode 14 side and the characteristic of the upper electrode 14 (e.g., the distributions of the concentration CA) are relatively similar to the characteristic of the recording layer 13 on the lower electrode 12 side and the characteristic of the lower electrode 12 (e.g., the distributions of the concentration CA), the embodiment is not limited thereto. For example, the characteristic of the upper electrode 14 illustrated in the nonvolatile memory device 320 may be combined with one selected from the characteristics of the lower electrodes 12 illustrated in the nonvolatile memory devices 321 to 324. In other words, the characteristic of the upper electrode 14 can be set arbitrarily and independently from the characteristic of the lower electrode 12.

Because the upper electrode 14 and the lower electrode 12 are mutually interchangeable, the characteristics of the upper electrode 14 and the recording layer 13 relating to the upper electrode 14 described in regard to the first embodiment may be applied to the characteristics of the lower electrode 12 and the recording layer 13 relating to the lower electrode 12.

In the nonvolatile memory devices 320 to 324 according to this embodiment, any method may be used to cause the main group element A included in the recording layer 13 to be contained in at least one selected from the upper electrode 14 and the lower electrode 12 with a concentration lower than the concentration of the recording layer 13; and a method similar to the method causing the main group element A to be contained in the upper electrode 14 in the first embodiment can be applied also to the lower electrode 12.

In the nonvolatile memory devices 310 to 314 and 320 to 324 according to the first and second embodiments recited above, the concentration CA of the main group element A in the at least one selected from the upper electrode 14 and the lower electrode 12 may be not less than 2 atomic percent and not more than 30 atomic percent.

The recording layer 13 may have one selected from a spinel structure represented by $A_xB_yO_4$ ($0.1 \leq x \leq 2.2$ and $1.5 \leq y \leq 2$), a delafossite structure represented by $A_xB_yO_2$ ($0.1 \leq x \leq 1.1$ and $0.9 \leq y \leq 1.1$), a wolframite structure represented by $A_xB_yO_4$ ($0.5 \leq x \leq 1.1$ and $0.7 \leq y \leq 1.1$), and an ilmenite structure represented by $A_xB_yO_3$ ($0.5 \leq x \leq 1.1$ and $0.9 \leq y \leq 1$), where A is the main group element A and B is the transition element.

The main group element A may be at least one selected from the group consisting of Zn, Cd, and Hg.

The transition element B may be at least one selected from the group consisting of Cr and Mn.

More specifically, the main group element A may be at least one selected from the group consisting of Zn, Cd, and Hg and the transition element B may be at least one selected from the group consisting of Cr and Mn.

Third Embodiment

FIGS. 14A and 14B are schematic views illustrating the configuration of a nonvolatile memory device according to a third embodiment.

Namely, FIG. 14A is a schematic cross-sectional view illustrating the configuration of the nonvolatile memory device 330 according to this embodiment. FIG. 14B is a graph illustrating the change of the concentrations of the main group element A of the lower electrode 12, the recording layer 13, and the upper electrode 14 of the nonvolatile memory device 330 according to this embodiment in which the axis in the perpendicular direction illustrates the position x in the film thickness direction inside the lower electrode 12, the recording layer 13, and the upper electrode 14, and the axis in the horizontal direction illustrates the concentration CA of the main group element A.

As illustrated in FIGS. 14A and 14B, the nonvolatile memory device 330 according to the third embodiment includes the recording layer 13, the upper electrode 14 (the first layer), and the lower electrode 12 (the second layer).

In other words, the nonvolatile memory device 330 further includes the lower electrode 12 made of at least one selected from a metal, a metal oxide, a metal nitride, and a metal carbide. The lower electrode 12 is provided adjacent to the recording layer 13 on the side opposite to the upper electrode 14 of the nonvolatile memory device 310 according to the first embodiment.

One selected from the upper electrode 14 and the lower electrode 12 having a lower potential applied thereto has a concentration CA of the main group element A higher than that of the other selected from the upper electrode 14 and the lower electrode 12.

Of the upper electrode 14 and the lower electrode 12 in this specific example, the potential applied to the upper electrode 14 is lower than the potential applied to the lower electrode 12. The concentration CA of the main group element A of the upper electrode 14 is higher than the concentration CA of the main group element A of the lower electrode 12. In other words, the concentration CA of the main group element A included in the upper electrode 14 which is the pole on the negative side is lower than that of the recording layer 13 and higher than that of the lower electrode 12 which is the pole on the positive side.

The nonvolatile memory device 330 according to this embodiment has higher repeated-operational stability for a unipolar operation in which, for example, of the upper electrode 14 and the lower electrode 12, the potential applied to the upper electrode 14 is lower than the potential applied to the lower electrode 12.

In the set operation SO of the nonvolatile memory device 330 of this specific example, for example, the potential applied to the upper electrode 14 is lower than the potential applied to the lower electrode 12; and at this time, the main group element A included in the recording layer 13 moves from the recording layer 13 into the upper electrode 14. Then, due to effects similar to those described in regard to the first embodiment, the main group element A moves easily from the recording layer 13 toward the upper electrode 14 by the concentration CA of the main group element A of the upper electrode 14 being set higher than that of the lower electrode 12. In other words, the set operation SO is easier and more stable.

Thereby, according to the nonvolatile memory device 330 according to this embodiment, a nonvolatile memory device having higher repeated-operational stability can be provided.

In the reset operation RO in the case of the nonvolatile memory device 330 according to this embodiment, the method that uses the Joule heat described above may be used.

In the nonvolatile memory apparatus 330 according to this embodiment, it is sufficient for the concentration CA of the main group element A included in the upper electrode 14 which is the pole on the negative side to be higher than that of the lower electrode 12 which is the pole on the positive side. Therefore, the main group element A may not be included in the lower electrode 12 which is the pole on the positive side.

Fourth Embodiment

A nonvolatile memory apparatus according to a fourth embodiment is a cross-point nonvolatile memory apparatus that uses the nonvolatile memory devices according to the first to third embodiments recited above.

Figure 15:
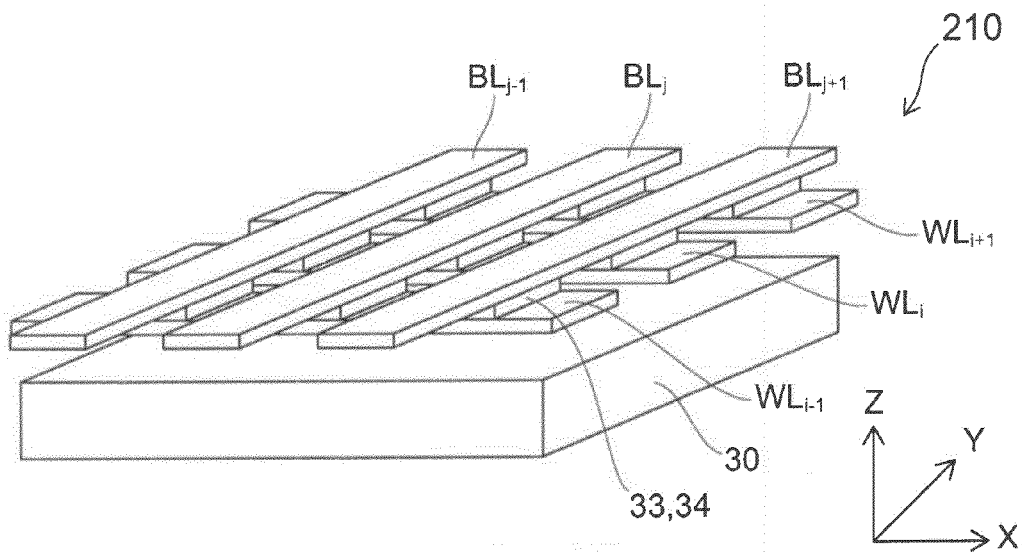
FIG. 15 is a schematic perspective view illustrating the configuration of a nonvolatile memory apparatus according to a fourth embodiment.

FIG. 15 is a schematic perspective view illustrating the configuration of the nonvolatile memory apparatus according to the fourth embodiment.

Figure 16:
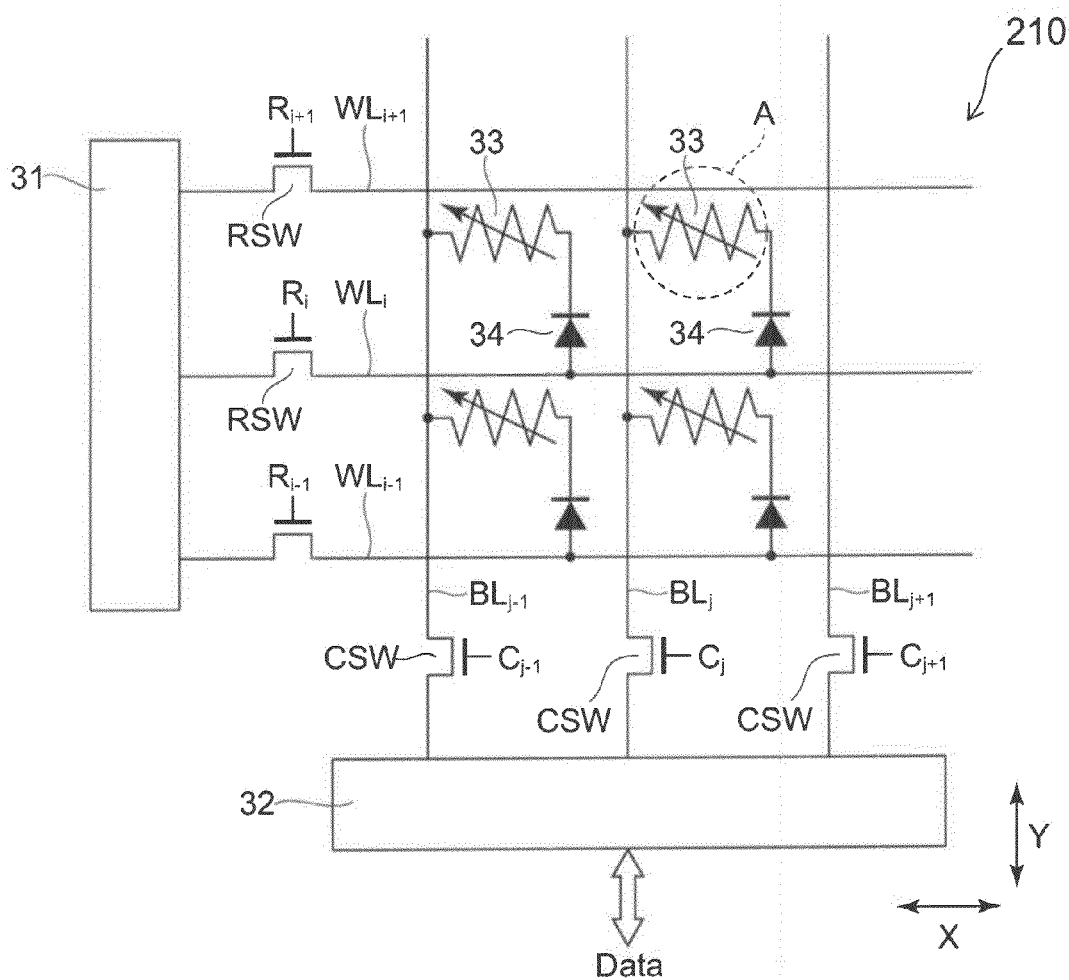
FIG. 16 is a schematic circuit diagram illustrating the configuration of the nonvolatile memory apparatus according to the fourth embodiment.

FIG. 16 is a schematic circuit diagram illustrating the configuration of the nonvolatile memory apparatus according to the fourth embodiment.

In the nonvolatile memory apparatus 210 according to this embodiment as illustrated in FIG. 15 and FIG. 16, the first interconnect (the word lines $WL_{i-1}$, $WL_i$ and $WL_{i+1}$) extending in a band configuration in the X-axis direction is provided on the major surface of a substrate 30. The second interconnect (the bit lines $BL_{j-1}$, $BL_j$, and $BL_{j+1}$) extending in a band configuration in the Y-axis direction orthogonal to the X axis in a plane parallel to the substrate 30 is provided to oppose the first interconnect (the word lines $WL_{i-1}$, $WL_i$, and $WL_{i+1}$).

Although the first interconnect and the second interconnect are orthogonal in the example recited above, it is sufficient for the first interconnect and the second interconnect to intersect (to be non-parallel).

Thus, a plane parallel to the major surface of the substrate 30 is taken as the X-Y plane; a direction in which the first interconnect extends is taken as the X axis; an axis orthogonal to the X axis in the X-Y plane is taken as the Y axis; and a direction perpendicular to the X axis and the Y axis is taken as a Z axis.

The index i and the index j recited above are arbitrary. In other words, although an example is illustrated in FIG. 15 and FIG. 16 in which three of the first interconnects and three of the second interconnects are provided, this is not limited thereto; and the number of the first interconnects and the number of the second interconnects are arbitrary. In this specific example, the first interconnect is a word line and the second interconnect is a bit line. However, the first interconnect may be the bit line and the second interconnect may be the word line. In the description hereinbelow, the first interconnect is the word line; and the second interconnect is the bit line.

As illustrated in FIG. 15 and FIG. 16, the memory cell 33 is interposed between the first interconnect and the second interconnect. In other words, in the nonvolatile memory apparatus 210, the memory cells 33 are provided at the intersections formed where the bit interconnects and the word interconnects intersect three-dimensionally.

As illustrated in FIG. 16, for example, one end of each of the word lines $WL_{i-1}$, $WL_i$ and $WL_{i+1}$ is connected to a word line driver 31, which has a decoder function, via a MOS transistor RSW used as a selection switch; and one end of each of the bit lines $BL_{j-1}$, $BL_j$, and $BL_{j+1}$ is connected to a bit line driver 32, which has decoder and read-out functions, via a MOS transistor CSW used as a selection switch.

Selection signals $R_{i-1}$, $R_i$, and $R_{i+1}$ for selecting one of the word lines (the rows) are input to the gates of the MOS transistors RSW; and selection signals $C_{i-1}$, $C_i$, and $C_{i+1}$ for selecting one of the bit lines (the columns) are input to the gates of the MOS transistors CSW.

The memory cells 33 are disposed at the intersections between the word lines $WL_{i-1}$, $WL_i$, and $WL_{i+1}$ and and the bit lines $BL_{j-1}$, $BL_j$, and $BL_{j+1}$ in a so-called cross-point cell array structure.

The rectifying element 34 may be added to the memory cell 33 to prevent sneak current during the recording/reproducing.

A feature of such a cross-point cell array structure is the advantage of higher bit densities because it is unnecessary for the MOS transistors to be connected individually to the memory cells 33.

As described above in regard to FIGS. 2A and 2B, the memory cell 33 and the rectifying element 34 are provided between the word line $WL_i$ and the bit line $BL_j$. The relationship of the vertical dispositions between the word line $WL_i$ and the bit line $BL_j$ is arbitrary. The relationship of the dispositions of the memory cell 33 and the rectifying element 34 between the word line $WL_i$ and the bit line $BL_j$ also is arbitrary.

As described above, one selected from the nonvolatile memory devices according to the first to third embodiments may be used as the memory cell 33. In other words, one selected from the nonvolatile memory devices according to the first to third embodiments may be used as the recording unit 22 of the memory cell 33.

The recording unit 22 includes the lower electrode 12, the upper electrode 14, and the recording layer 13 provided between the lower electrode 12 and the upper electrode 14.

Here, the recording layer 13, the lower electrode 12, and the upper electrode 14 described in regard to the first to third embodiments may be used as the recording layer 13, the lower electrode 12, and the upper electrode 14 respectively.

In the nonvolatile memory apparatus 210 according to this embodiment having such a configuration, the word line driver 31 and the bit line driver 32 which are the drive unit are configured to perform at least one selected from applying a voltage to the recording layer 13 of the nonvolatile memory device of the memory cell 33 and causing a current to flow in the recording layer 13 via the word line $WL_i$ and the bit line $BL_j$. Thereby, the drive unit is configured to record information by causing the recording layer 13 to transition between the high resistance state and the low resistance state. The drive unit can read the information recorded in the recording layer 13.

In other words, the nonvolatile memory apparatus 210 according to this embodiment includes one selected from the nonvolatile memory devices according to the first to third embodiments and the drive unit configured to record information by causing the recording layer 13 to transition between the high resistance state and the low resistance state by at least one selected from applying the voltage to the recording layer 13 of the nonvolatile memory device and causing the current to flow in the recording layer 13.

The nonvolatile memory apparatus 210 further includes the word line $WL_i$ and the bit line $BL_j$ provided with the nonvolatile memory device interposed; and the drive unit is configured to perform the at least one selected from applying the voltage to the recording layer 13 and causing the current to flow in the recording layer 13 via the word line $WL_i$ and the bit line $BL_j$.

According to the nonvolatile memory apparatus 210 according to this embodiment having such a configuration, a nonvolatile memory apparatus having high repeated-operational stability can be provided.

Figure 17:
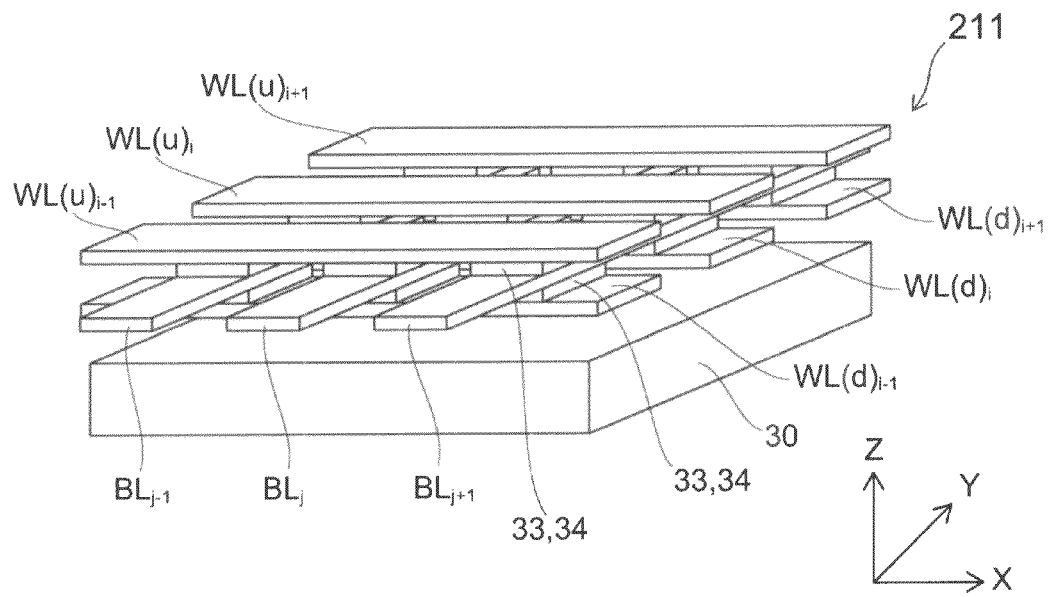
FIG. 17 is a schematic perspective view illustrating the configuration of another nonvolatile memory apparatus according to the fourth embodiment.

FIG. 17 is a schematic perspective view illustrating the configuration of another nonvolatile memory apparatus according to the fourth embodiment.

Figure 18:
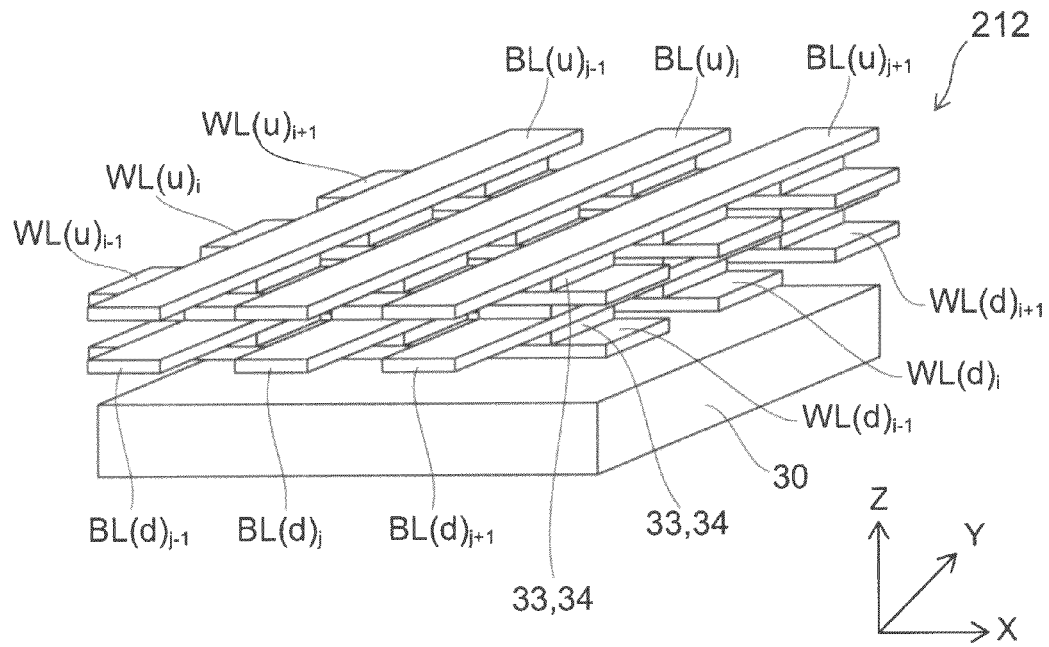
FIG. 18 is a schematic perspective view illustrating the configuration of another nonvolatile memory apparatus according to the fourth embodiment.

FIG. 18 is a schematic perspective view illustrating the configuration of another nonvolatile memory apparatus according to the fourth embodiment.

As illustrated in FIG. 17, the nonvolatile memory apparatus 211 may have a three-dimensional structure in which a stacked structural body made of the word line, the bit line, and the memory cell 33 interposed therebetween is stacked in two layers.

Also, as illustrated in FIG. 18, the nonvolatile memory apparatus 212 may have a three-dimensional structure in which the stacked structural body made of the word line, the bit line, and the memory cell 33 interposed therebetween is stacked in three layers.

Thus, the nonvolatile memory apparatus may have a three-dimensional structure in which the stacked structural body made of the word line, the bit line, and the memory cell 33 interposed therebetween is stacked in multiple layers; and the number of stacks is arbitrary.

Fifth Embodiment

A fifth embodiment is a probe memory-type nonvolatile memory apparatus.

Figure 19:
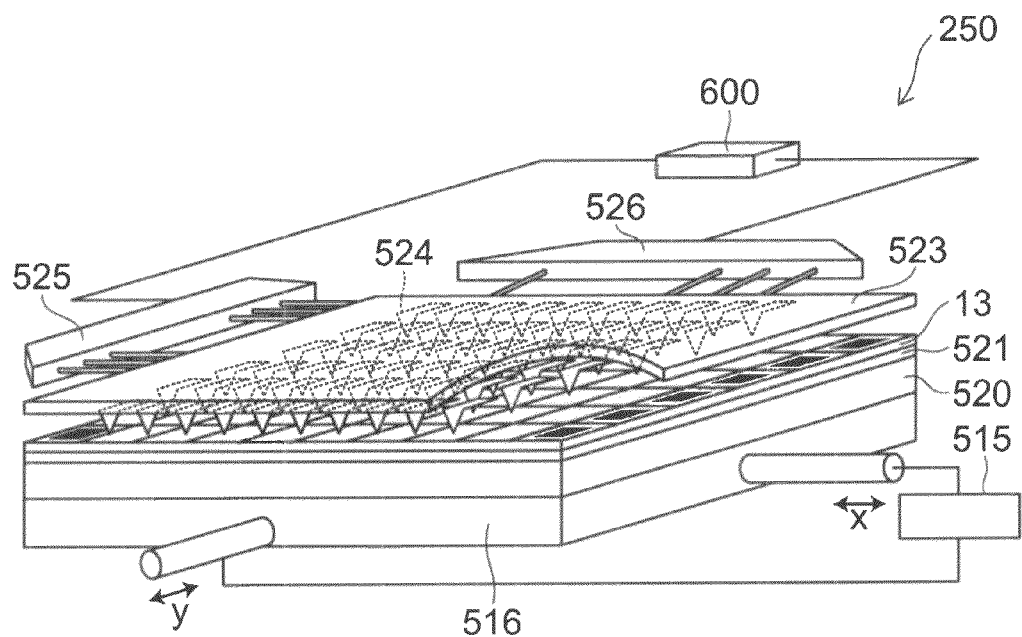
FIG. 19 is a schematic perspective view illustrating the configuration of a nonvolatile memory apparatus according to a fifth embodiment.

FIG. 19 is a schematic perspective view illustrating the configuration of the nonvolatile memory apparatus according to the fifth embodiment.

Figure 20:
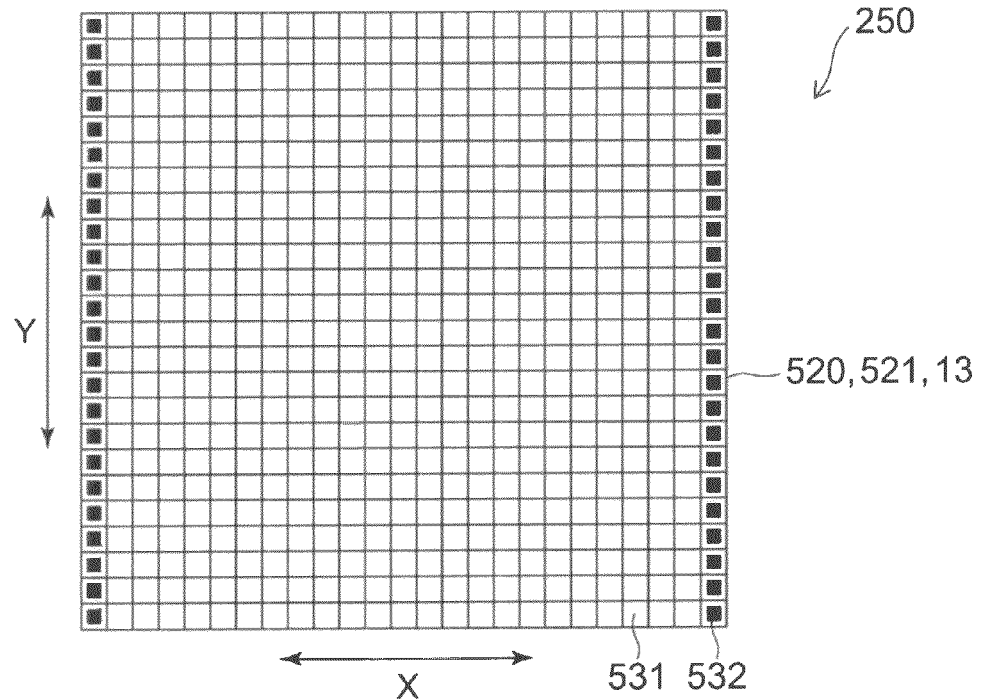
FIG. 20 is a schematic plan view illustrating the configuration of the nonvolatile memory apparatus according to the fifth embodiment.

FIG. 20 is a schematic plan view illustrating the configuration of the nonvolatile memory apparatus according to the fifth embodiment.

In the nonvolatile memory apparatus 250 according to the fifth embodiment as illustrated in FIG. 19 and FIG. 20, the recording layer 13 is provided on an electrode 521 disposed on an XY scanner 516. A probe array is disposed to oppose the recording layer 13.

The probe array includes a substrate 523 and multiple probes (heads) 524 disposed in an array configuration on one side of the substrate 523. Each of the multiple probes 524 includes, for example, a cantilever and is driven by multiplex drivers 525 and 526.

Although each of the multiple probes 524 is individually operable using microactuators inside the substrate 523, all of the multiple probes 524 may be operated collectively with the same operation to access a data area 531 of the storage medium (the recording layer 13).

First, all of the probes 524 are operated back and forth in the X direction at a constant period using the multiplex drivers 525 and 526; and positional information of the Y direction is read from a servo area 532 of the recording medium (the recording layer 13). The positional information of the Y direction is transferred to a driver 515.

The driver 515 drives the XY scanner 516 based on the positional information, moves the recording medium (the recording layer 13) in the Y direction, and performs positional alignment between the recording medium (the recording layer 13) and the probes.

When the positional alignment thereof is completed, data is read or programmed simultaneously and continuously for all of the probes 524 on the data area 531.

Data can be read and programmed continuously because the probes 524 operate back and forth in the X direction. The reading and programming of the data is implemented one row at a time for the data area 531 by progressively changing the Y-direction position of the recording layer 13.

The recording medium (the recording layer 13) may be moved back and forth in the X direction at a constant period; positional information may be read from the recording medium (the recording layer 13); and the probes 524 may be moved in the Y direction.

The recording layer 13 is provided, for example, on the electrode 521 provided in a substrate 520.

The recording layer 13 includes multiple data areas 531 and servo areas 532 disposed at both X-direction ends of the multiple data areas 531. The multiple data areas 531 make up the main components of the recording layer 13.

Servo burst signals are stored in the servo areas 532. The servo burst signals indicate the positional information in the data areas 531 in the Y direction.

Further, in addition to such information, an address area in which address data is recorded and a preamble area for synchronization are disposed in the recording layer 13.

The data and the servo burst signal are stored in the recording layer 13 as storage bits (electrical resistance fluctuation). "1" and "0" information of each storage bit is read by detecting the electrical resistance of the recording layer 13.

In this specific example, one probe (head) is provided corresponding to one data area 531; and one probe is provided for one servo area 532.

The data area 531 is formed from multiple tracks. The track of the data area 531 is designated by an address signal read from the address area. The servo burst signal read from the servo area 532 eliminates reading errors of the storage bits by moving the probes 524 to the center of the track.

Here, it is possible to utilize, for example, head position control technology of HDDs by having the X direction correspond to the down-track direction and the Y direction correspond to the track direction.

Each of the probes 524 are connected to a drive unit 600 via, for example, the multiplex drivers 525 and 526. The drive unit 600 supplies at least one selected from the voltage and the current for the information recording to each of the probes 524. The recording layer 13 transitions between the high resistance state and the low resistance state by the voltage and the current provided via the probe 524. The drive unit 600 detects the high resistance state and the low resistance state recorded in the recording layer 13 to read the recorded information.

The recording layer 13 of one selected from the nonvolatile memory devices described in regard to the first to third embodiments may be used as the recording layer 13 of the nonvolatile memory apparatus 250 having such a configuration. The upper electrode 14 or the lower electrode 12 of one selected from the nonvolatile memory devices described in regard to the first to third embodiments may be used as the electrode 521. In other words, one selected from the nonvolatile memory devices described in regard to the first to third embodiments may be used as the recording layer 13 and the electrode 521.

In other words, the nonvolatile memory apparatus 250 according to this embodiment includes one selected from the nonvolatile memory devices described in regard to the first to third embodiments and the drive unit 600 configured to record information by causing the recording layer 13 to transition between the high resistance state and the low resistance state by at least one selected from applying the voltage to the recording layer 13 of the nonvolatile memory device and causing the current to flow in the recording layer 13.

The nonvolatile memory apparatus 250 further includes the probe 524 provided together with the nonvolatile memory device including the recording layer 13 and the electrode 521; and the drive unit 600 is configured to perform at least one selected from applying the voltage to the unit of recording of the recording layer 13 of the nonvolatile memory device and causing the current to flow in the unit of recording via the probe 524.

The drive unit 600 may include the driver 515 and the XY scanner 516 recited above; and conversely, the drive unit 600 may not include the driver 515 and the XY scanner 516 recited above.

Thereby, according to the probe memory-type nonvolatile memory apparatus 250 according to this embodiment as well, a nonvolatile memory apparatus having high repeated-operational stability can be provided due to the effects described in regard to the nonvolatile memory devices according to the first to third embodiments described above.

Sixth Embodiment

A sixth embodiment is a flash memory-type nonvolatile memory apparatus.

FIG. 21 is a schematic cross-sectional view illustrating the configuration of the components of the nonvolatile memory apparatus according to the sixth embodiment.

FIG. 22 is a schematic cross-sectional view illustrating operations of the nonvolatile memory apparatus according to the sixth embodiment.

As illustrated in FIG. 21, the nonvolatile memory apparatus 260 according to this embodiment includes a flash memory-type memory cell; and the memory cell is formed from a MIS (metal-insulator-semiconductor) transistor.

In other words, diffusion layers 42 are formed in the surface region of a semiconductor substrate 41. A gate insulation layer 43 is formed on the channel region between the diffusion layers 42. A nonvolatile memory device 44 according to the embodiment is formed on the gate insulation layer 43. A control gate electrode 45 is formed on the nonvolatile memory device 44.

Herein, one selected from the nonvolatile memory devices according to the first to third embodiments may be used as the nonvolatile memory device 44.

In other words, although not illustrated in FIG. 21, the nonvolatile memory device 44 includes the recording layer 13 and the upper electrode 14 described in regard to the nonvolatile memory devices according to the first to third embodiments. The nonvolatile memory device 44 further includes the lower electrode 12 described in regard to the nonvolatile memory devices according to the first to third embodiments.

In other words, the nonvolatile memory apparatus 260 according to this embodiment includes at least one selected from the nonvolatile memory devices described in regard to the first to third embodiments and a drive unit (not illustrated) configured to record information by causing the recording layer 13 to transition between the high resistance state and the low resistance state by applying the voltage to the recording layer 13 of the nonvolatile memory device or causing the current to flow in the recording layer 13.

The drive unit in such a case is connected to the control gate electrode 45; and the drive unit is configured to perform the at least one selected from applying the voltage to the recording layer 13 and causing the current to flow in the recording layer 13 by the control gate electrode 45.

In other words, the nonvolatile memory apparatus 260 according to this embodiment further includes a MIS transistor that includes a gate electrode (the control gate electrode 45) and a gate insulating film (the gate insulation layer 43). The nonvolatile memory device 44 is provided between the gate electrode and the gate insulation layer of the MIS transistor.

In the description recited above, at least one selected from the upper electrode 14 and the lower electrode 12 of the nonvolatile memory device 44 also may be used as, for example, the control gate electrode 45.

The semiconductor substrate 41 may be a well region; and the semiconductor substrate 41 and the diffusion layer 42 have mutually opposite conductivity types. The control gate electrode 45 forms the word line and includes, for example, conductive polysilicon.

In the set (the programming) operation SO as illustrated in FIG. 22, a potential V1 is provided to the control gate electrode 45; and a potential V2 is provided to the semiconductor substrate 41.

The difference between the potential V1 and the potential V2 is sufficiently large enough to cause the recording layer 13 of the nonvolatile memory device 44 to transition between the high resistance state and the low resistance state. However, the polarity of the difference between the potentials is not particularly limited. In other words, it may be that V1>V2 or V1<V2.

For example, assuming that the recording layer 13 is in the high resistance phase HR in the initial state (the reset state), the threshold value of the memory cell (the MIS transistor) increases because it is substantially as if the gate insulation layer 43 were thicker.

When the potentials V1 and V2 are applied to change the recording layer 13 from this state to the low resistance phase LR, the threshold value of the memory cell (the MIS transistor) decreases because it is substantially as if the gate insulation layer 43 were thinner.

Although the potential V2 is applied to the semiconductor substrate 41, the potential V2 may be transferred from the diffusion layer 42 to the channel region of the memory cell instead.

In this drawing, arrow Ae illustrates the movement of the electrons; and arrow Ai illustrates the movement of the ions.

On the other hand, in the reset (the erasing) operation RO, a potential V1' is applied to the control gate electrode 45; a potential V3 is applied to one of the diffusion layers 42; and a potential V4 (<V3) is applied to one other of the diffusion layers 42.

The potential V1' has a value exceeding the threshold value of the memory cell of the set state.

At this time, the memory cell is switched ON; electrons flow from the one other of the diffusion layers 42 toward the one of the diffusion layers 42; and hot electrons are generated. The temperature of the recording layer 13 increases because the hot electrons are injected into the recording layer 13 via the gate insulation layer 43.

Thereby, it is substantially as if the gate insulation layer 43 were thicker and the threshold value of the memory cell (the MIS transistor) increases because the recording layer 13 changes from the low resistance phase LR to the high resistance phase HR.

Thus, the threshold value of the memory cell can be changed by a principle similar to that of flash memory; and utilization is possible as a nonvolatile memory apparatus.

Because one selected from the nonvolatile memory devices described in regard to the first to third embodiments is used as the nonvolatile memory device 44 of the nonvolatile memory apparatus 260 according to this embodiment in such a case, a nonvolatile memory apparatus capable of repeated nonvolatile stable operations can be provided.

Figure 23:
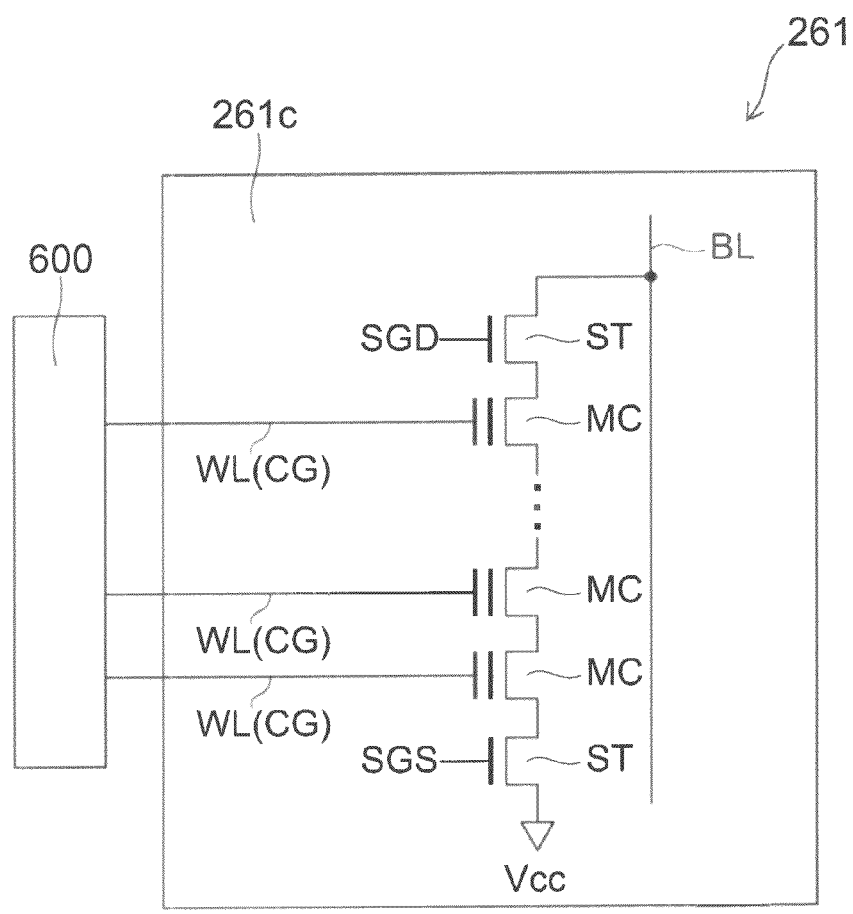
FIG. 23 is a schematic view illustrating the configuration of the components of another nonvolatile memory apparatus according to the sixth embodiment.

FIG. 23 is a schematic view illustrating the configuration of the components of another nonvolatile memory apparatus according to the sixth embodiment.

Figure 24:
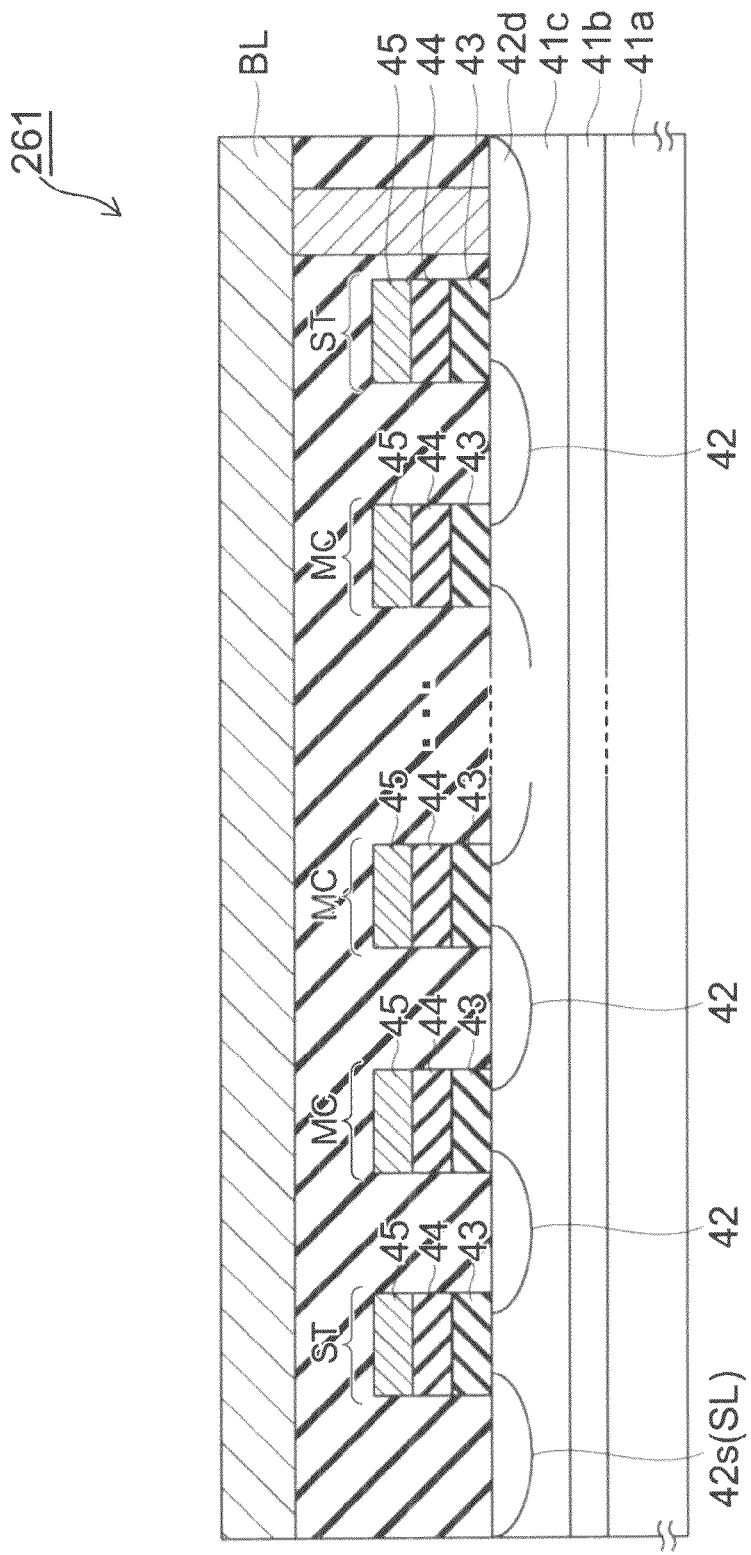
FIG. 24 is a schematic cross-sectional view illustrating the components of another nonvolatile memory apparatus according to the sixth embodiment.

FIG. 24 is a schematic cross-sectional view illustrating the components of another nonvolatile memory apparatus according to the sixth embodiment.

In other words, the nonvolatile memory apparatus 261 according to this embodiment is a NAND flash memory. FIG. 23 illustrates a NAND cell unit 261c and the drive unit 600 connected thereto; and FIG. 24 illustrates the structure of the NAND cell unit 261c.

As illustrated in FIG. 23 and FIG. 24, an N-type well region 41b and a P-type well region 41c are formed inside a P-type semiconductor substrate 41a. The NAND cell unit 261c is formed inside the P-type well region 41c.

The NAND cell unit 261c includes a NAND string made of multiple memory cells MC connected in series and a total of two selection gate transistors ST connected to the two ends of the NAND string respectively.

The memory cell MC and the selection gate transistor ST have the same structure. Specifically, both include the N-type diffusion layers 42, the gate insulation layer 43 on the channel region between the N-type diffusion layers 42, the nonvolatile memory device 44 on the gate insulation layer 43, and the control gate electrode 45 (the CG) on the nonvolatile memory device 44.

Each of the control gate electrodes 45 (the CG) is electrically connected to the drive unit 600. The drive unit 600 may be provided in the substrate in which the NAND cell unit 261c is provided or may be provided separately from the substrate.

At least one selected from the nonvolatile memory devices according to the first to third embodiments may be used as the nonvolatile memory device 44. In other words, although not illustrated in these drawings, at least one selected from the recording layer 13, the upper electrode 14, and the lower electrode 12 described in regard to the first to third embodiments may be provided in the nonvolatile memory device 44.

The states (the high resistance phase HR and the low resistance phase LR) of the recording layer 13 of the nonvolatile memory device 44 which is the memory cell MC are capable of being changed by the operations described above. Conversely, the recording layer 13 of the selection gate transistor ST is fixed in the set state, i.e., the low resistance phase LR.

One of the selection gate transistors ST is connected to a source line SL; and one other of the selection gate transistors ST is connected to a bit line BL.

Prior to the set (the programming) operation SO, all of memory cells inside the NAND cell unit 261c are taken as being in the reset state (having the high resistance).

The set (the programming) operation SO is performed for one memory cell MC at a time in order from the memory cell MC on the source line SL side toward the memory cell MC on the bit line BL side.

The potential V1 (a positive potential) is applied as a programming potential to the selected word line (the control gate electrode) WL; and a potential $V_{pass}$ is applied as a transfer potential (a potential that switches the memory cell MC ON) to the unselected word lines WL.

The selection gate transistor ST on the source line SL side is switched OFF; the selection gate transistor ST on the bit line BL side is switched ON; and the program data is transferred from the bit line BL into the channel region of the selected memory cell MC.

For example, when the program data is a "1," a write-protect potential (e.g., a potential about the same as V1) is transferred to the channel region of the selected memory cell MC; and the resistance value of the recording layer 13 of the selected memory cell MC is prevented from changing from the high state to the low state.

When the program data is a "0," V2 (<V1) is transferred to the channel region of the selected memory cell MC; and the resistance value of the recording layer 13 of the selected memory cell MC is changed from the high state to the low state.

On the other hand, in the reset (the erasing) operation RO, for example, V1' is applied to all of the word lines (the control gate electrodes) WL; and all of the memory cells MC inside the NAND cell unit 261c are switched ON. The two selection gate transistors ST are switched ON; V3 is applied to the bit line BL; and V4 (<V3) is applied to the source line SL.

At this time, because hot electrons are injected into the recording layer 13 of all of the memory cells MC inside the NAND cell unit 261c, the reset operation is collectively executed for all of the memory cells MC in the NAND cell unit 261c.

In the reading operation, the reading potential (the positive potential) is applied to the selected word line (control gate electrode) WL; and a potential is applied to the unselected word lines (control gate electrodes) WL such that the memory cells MC are switched ON regardless of whether the data is a "0" or a "1."

Then, the two selection gate transistors ST are switched ON and the reading current is supplied to the NAND string.

Because the selected memory cell MC is switched ON or OFF according to the value of the data stored therein when the reading potential is applied, the data can be read by, for example, detecting the change of the reading current.

Although the selection gate transistors ST have the same structures as the memory cells MC in the structure illustrated in FIG. 24, the following variations are possible.

Figure 25:
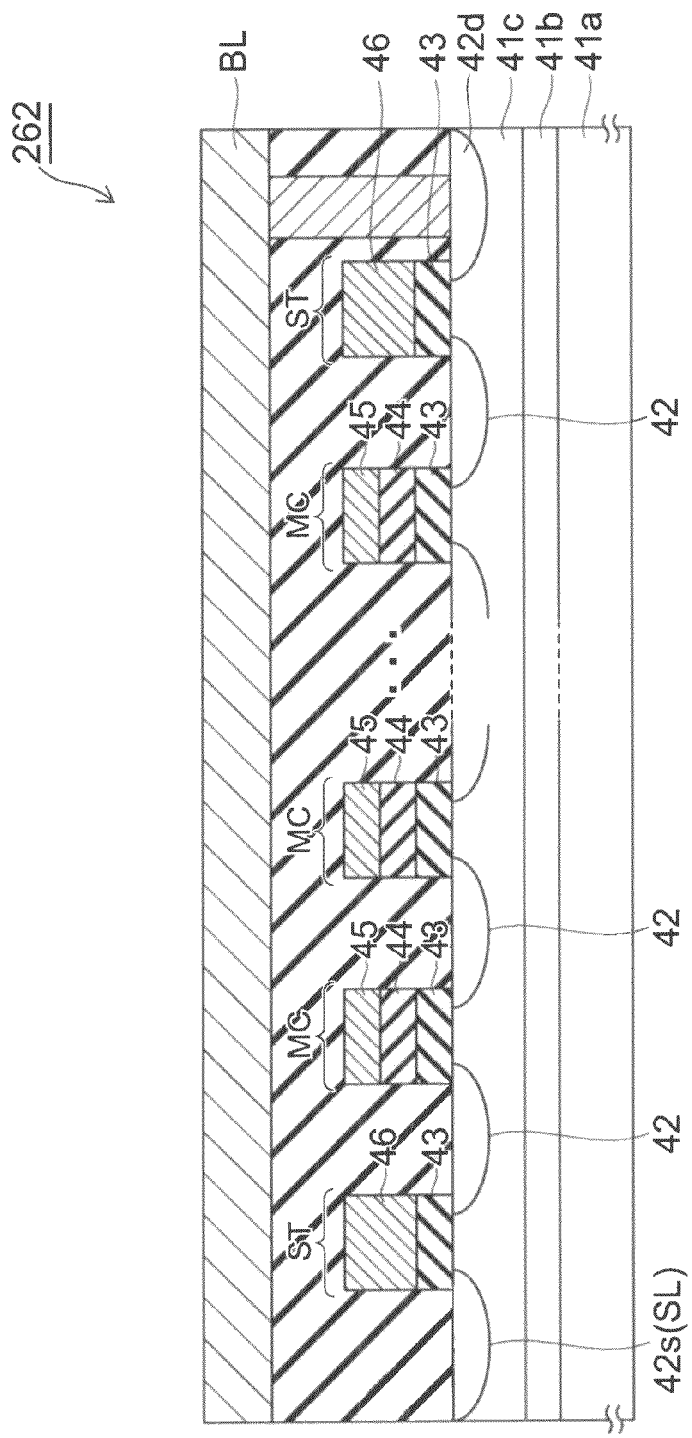
FIG. 25 is a schematic cross-sectional view illustrating the components of a nonvolatile memory apparatus of a variation according to the sixth embodiment.

FIG. 25 is a schematic cross-sectional view illustrating the components of the nonvolatile memory apparatus of a variation according to the sixth embodiment.

In the nonvolatile memory apparatus 262 of the variation according to this embodiment as illustrated in FIG. 25, the selection gate transistors ST are normal MIS transistors without the recording layers being formed.

Figure 26:
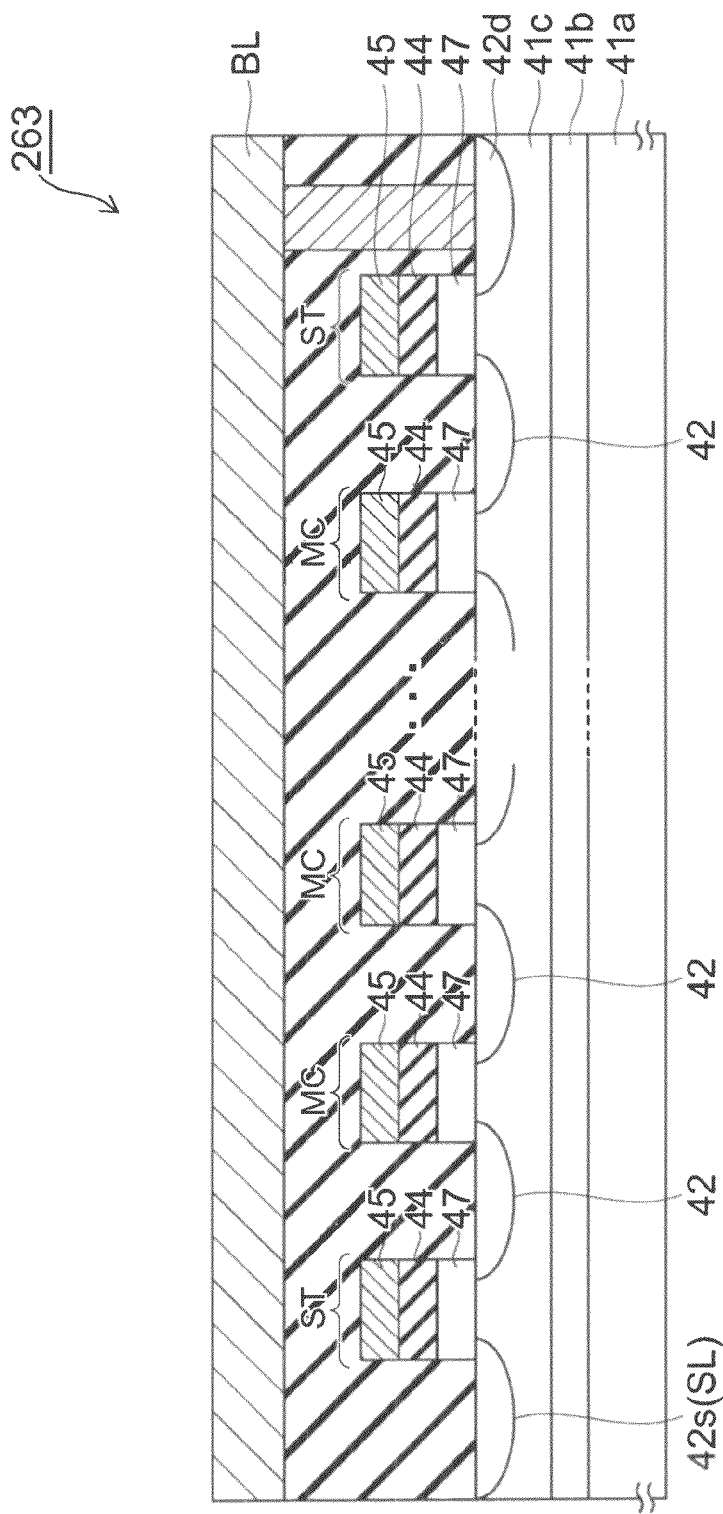
FIG. 26 is a schematic cross-sectional view illustrating the components of a nonvolatile memory apparatus of a variation according to the sixth embodiment.

FIG. 26 is a schematic cross-sectional view illustrating the components of the nonvolatile memory apparatus of a variation according to the sixth embodiment.

In the nonvolatile memory apparatus 263 of the variation according to this embodiment as illustrated in FIG. 26, the gate insulation layer of the multiple memory cells MC included in the NAND string is replaced with a P-type semiconductor layer 47.

As high integration advances and the memory cells MC are downscaled, the P-type semiconductor layer 47 is filled by a depletion layer in the state in which a voltage is not applied.

In the set (the programming) operation SO, a positive programming potential (e.g., 3.5 V) is applied to the control gate electrode 45 of the selected memory cell MC; and a positive transfer potential (e.g., 1 V) is applied to the control gate electrodes 45 of the unselected memory cells MC.

At this time, the surfaces of the P-type well regions 41c of the multiple memory cells MC inside the NAND string are inverted from the P-type to the N-type; and channels are formed.

Then, as described above, the set operation can be performed by switching the selection gate transistor ST on the bit line BL side ON and transferring the program data "0" from the bit line BL to the channel region of the selected memory cell MC.

On the other hand, the reset (the erasing) operation RO can be collectively performed for all of the memory cells MC included in the NAND string by, for example, applying a negative erasing potential (e.g., −3.5 V) to all of the control gate electrodes 45 and applying the grounding potential (0 V) to the P-type well region 41c and the P-type semiconductor layers 47.

In the reading, a positive reading potential (e.g., 0.5 V) is applied to the control gate electrode 45 of the selected memory cell MC; and a transfer potential (e.g., 1 V) is applied to the control gate electrodes 45 of the unselected memory cells MC to switch the memory cells MC ON regardless of whether the data is a "0" or a "1."

However, a threshold voltage Vth "1" of the memory cells MC in the "1" state is taken to be in the range of 0 V<Vth "1"<0.5 V; and a threshold voltage Vth "0" of the memory cells MC in the "0" state is taken to be in the range of 0.5 V<Vth "0"<1 V.

The two selection gate transistors ST are switched ON and the reading current is supplied to the NAND string.

In such a state, the amount of current flowing in the NAND string changes according to the value of the data stored in the selected memory cell MC. Therefore, the data can be read by detecting the change.

In this variation, it is desirable for the hole doping amount of the P-type semiconductor layer 47 to be greater than that of the P-type well region 41c, and for the Fermi level of the P-type semiconductor layer 47 to be about 0.5 V deeper than that of the P-type well region 41c.

This is because, when a positive potential is applied to the control gate electrode 45, the P-type starts inverting to the N-type from the surface portion of the P-type well region 41c between the N-type diffusion layers 42; and a channel is formed.

Thus, for example, during the programming, the channels of the unselected memory cells MC are selectively formed at the interface between the P-type well region 41c and the P-type semiconductor layers 47; and during the reading, the channels of the multiple memory cells MC in the NAND string are selectively formed at the interfaces between the P-type well region 41c and the P-type semiconductor layers 47.

That is, even in the case where the recording layer 13 of the nonvolatile memory device 44 used in the memory cell MC is in the low resistance phase LR, the diffusion layer 42 and the control gate electrode 45 are not shorted.

Figure 27:
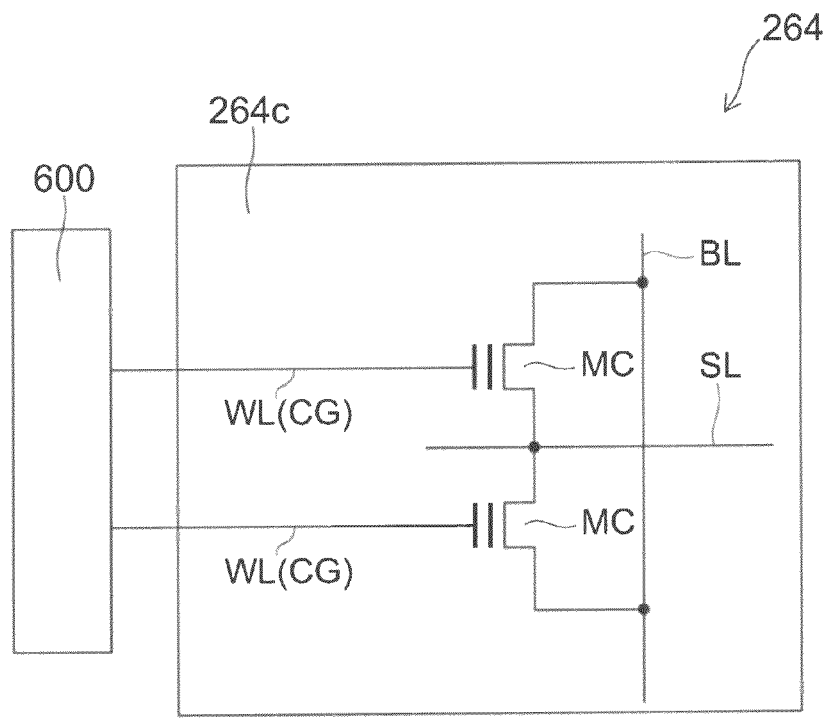
FIG. 27 is a schematic view illustrating the configuration of the components of another nonvolatile memory apparatus according to the sixth embodiment.

FIG. 27 is a schematic view illustrating the configuration of the components of another nonvolatile memory apparatus according to the sixth embodiment.

Figure 28:
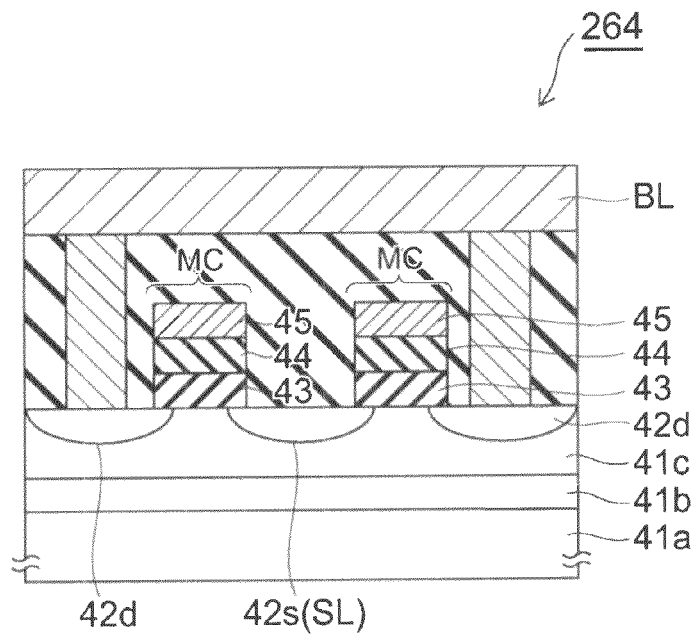
FIG. 28 is a schematic cross-sectional view illustrating the components of the nonvolatile memory apparatus according to the sixth embodiment.

FIG. 28 is a schematic cross-sectional view illustrating the components of this nonvolatile memory apparatus according to the sixth embodiment.

The nonvolatile memory apparatus 264 according to this embodiment is a NOR flash memory. FIG. 27 illustrates a NOR cell unit 264c and the drive unit 600 connected thereto. FIG. 28 illustrates the structure of the NOR cell unit 264c.

As illustrated in FIG. 27 and FIG. 28, the N-type well region 41b and the P-type well region 41c are formed inside the P-type semiconductor substrate 41a. NOR cells are formed inside the P-type well region 41c.

The NOR cell includes one memory cell (a MIS transistor) MC connected between the bit line BL and the source line SL.

The memory cell MC includes the N-type diffusion layers 42, the gate insulation layer 43 on the channel region between the N-type diffusion layers 42, the nonvolatile memory device 44 on the gate insulation layer 43, and the control gate electrode 45 on the nonvolatile memory device 44.

Each of the control gate electrodes 45 (the CG) is electrically connected to the drive unit 600. The drive unit 600 may be provided in the substrate in which the NOR cell unit 264c is provided or may be provided separately from the substrate.

The states (the high resistance phase HR and the low resistance phase LR) of the recording layer 13 of the nonvolatile memory device 44 used in the memory cell MC are capable of being changed by the operations described above.

Figure 29:
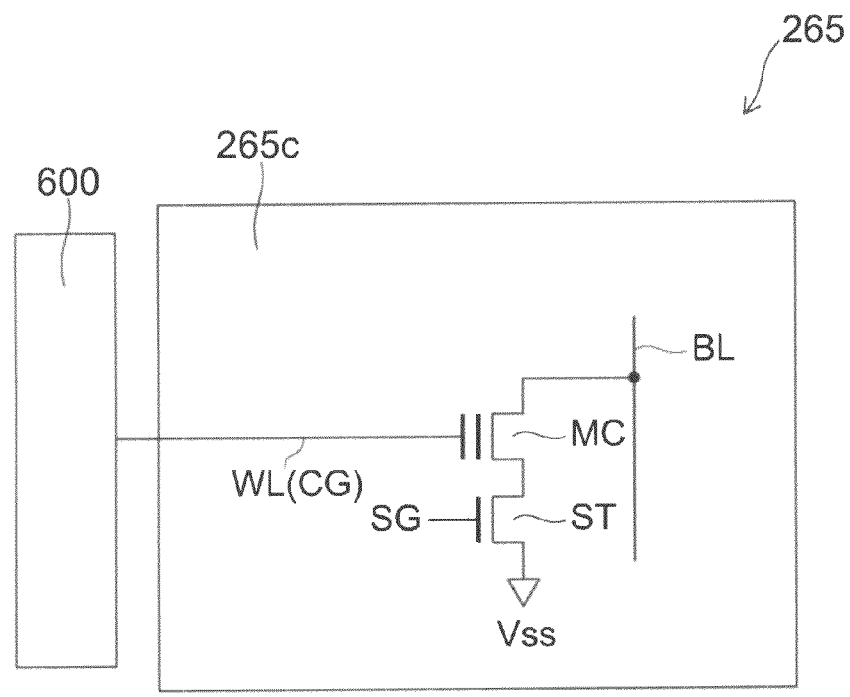
FIG. 29 is a schematic view illustrating the configuration of the components of another nonvolatile memory apparatus according to the sixth embodiment.

FIG. 29 is a schematic view illustrating the configuration of the components of another nonvolatile memory apparatus according to the sixth embodiment.

Figure 30:
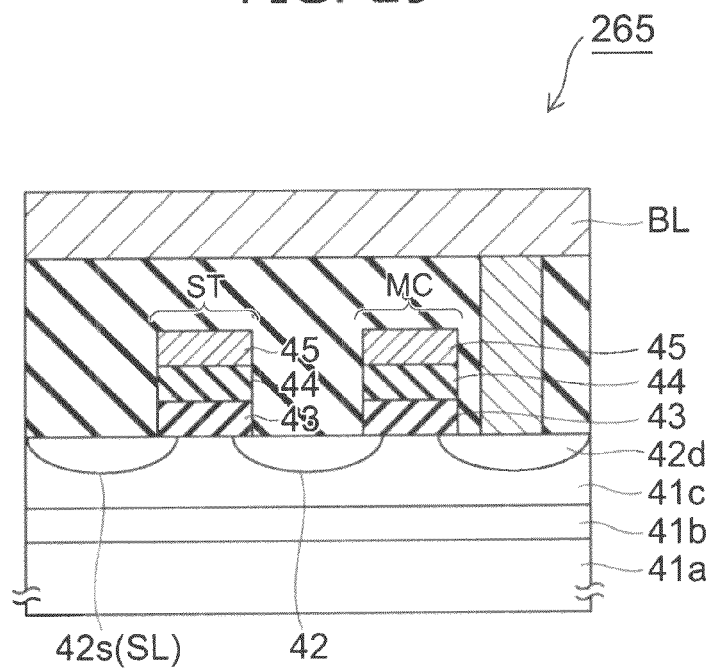
FIG. 30 is a schematic cross-sectional view illustrating the components of the nonvolatile memory apparatus according to the sixth embodiment.

FIG. 30 is a schematic cross-sectional view illustrating the components of this nonvolatile memory apparatus according to the sixth embodiment.

In other words, the nonvolatile memory apparatus 265 according to this embodiment is a two-transistor flash memory. FIG. 29 illustrates a two-transistor cell unit 265c and the drive unit 600 connected thereto. FIG. 30 illustrates the structure of the two-transistor cell unit 265c.

As illustrated in FIG. 29 and FIG. 30, the two-transistor cell unit 265c has a cell structure that combines features of the NAND cell unit with features of the NOR cell.

The N-type well region 41b and the P-type well region 41c are formed inside the P-type semiconductor substrate 41a. The two-transistor cell unit 265c is formed inside the P-type well region 41c.

The two-transistor cell unit 265c includes one memory cell MC and the one selection gate transistor ST connected in series.

The memory cell MC and the selection gate transistor ST have the same structure. Specifically, both include the N-type diffusion layers 42, the gate insulation layer 43 on the channel region between the N-type diffusion layers 42, the nonvolatile memory device 44 on the gate insulation layer 43, and the control gate electrode 45 on the nonvolatile memory device 44.

Each of the control gate electrodes 45 (the CG) is electrically connected to the drive unit 600. The drive unit 600 may be provided in the substrate in which the two-transistor cell unit 265c is provided or may be provided separately from the substrate.

The states (the high resistance phase HR and the low resistance phase LR) of the recording layer 13 of the nonvolatile memory device 44 used in the memory cell MC are capable of being changed by the operations described above. Conversely, the recording layer 13 of the selection gate transistor ST is fixed in the set state, i.e., the low resistance phase LR.

The selection gate transistor ST is connected to the source line SL; and the memory cell MC is connected to the bit line BL.

The states (the high resistance phase HR and the low resistance phase LR) of the recording layer 13 of the nonvolatile memory device 44 used in the memory cell MC are capable of being changed by the operations described above.

Although the selection gate transistor ST and the memory cell MC have the same structure in the structure illustrated in FIG. 30, the following variation is possible.

Figure 31:
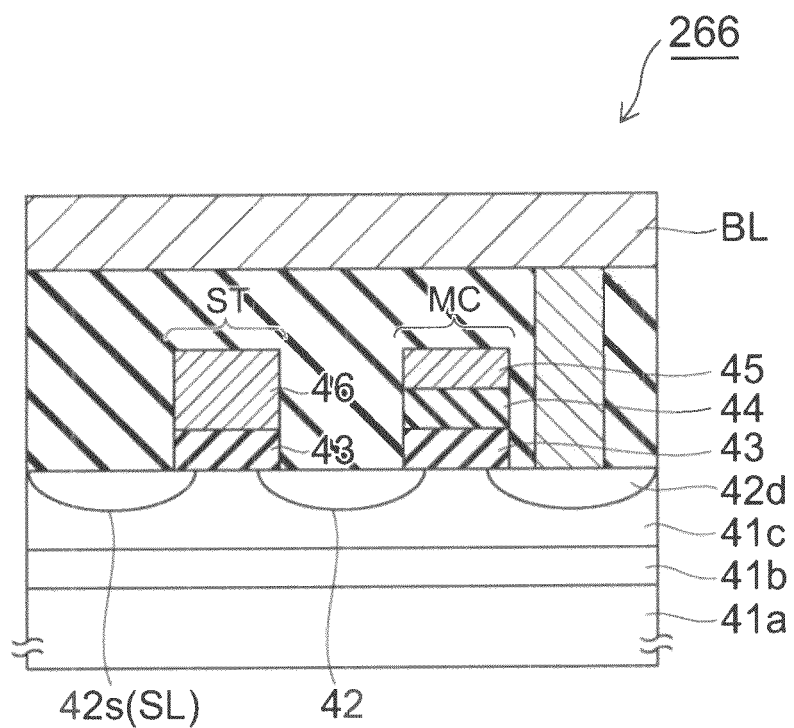
FIG. 31 is a schematic cross-sectional view illustrating the components of a nonvolatile memory apparatus of a variation according to the sixth embodiment.

FIG. 31 is a schematic cross-sectional view illustrating the components of the nonvolatile memory apparatus of this variation according to the sixth embodiment.

In the nonvolatile memory apparatus 266 of the variation according to this embodiment as illustrated in FIG. 31, the selection gate transistor ST may be a normal MIS transistor without the nonvolatile memory device 44 being formed.

According to the embodiments, a nonvolatile memory device and a nonvolatile memory apparatus having high repeated-operational stability are provided.

Hereinabove, exemplary embodiments are described with reference to specific examples. However, the invention is not limited to these specific examples. For example, one skilled in the art may similarly practice the invention by appropriately selecting specific configurations of components included in nonvolatile memory devices and nonvolatile memory apparatuses from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile memory devices and nonvolatile memory apparatuses practicable by an appropriate design modification by one skilled in the art based on the nonvolatile memory devices and the nonvolatile memory apparatuses described above as embodiments of the invention also are within the scope of the invention to the extent that the purport of the invention is included.

Furthermore, various variations and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A nonvolatile memory device, comprising:
   a recording layer including
      a main group element,
      a transition element, and
      oxygen,
      the recording layer being capable of recording information by changing reversibly between a high resistance state and a low resistance state; and
   a conductive first layer made of at least one selected from a metal, a metal oxide, a metal nitride, and a metal carbide and provided adjacent to the recording layer, the first layer including the main group element with a concentration lower than a concentration of the main group element of the recording layer.

2. The device according to claim 1, wherein a region of the first layer close to a first interface between the recording layer and the first layer has a concentration of the main group element higher than a concentration of the main group element of a region of the first layer far to the first interface.

3. The device according to claim 1, wherein a close region of the first layer close to a first interface between the recording layer and the first layer has a concentration of the main group element higher than a concentration of the main group element of an intermediate region of the first layer far to the first interface, and a far region of the first layer farther to the first interface than the intermediate region of the first layer has a concentration of the main group element higher than the concentration of the main group element of the intermediate region of the first layer.

4. The device according to claim 1, wherein the concentration of the main group element of the first layer is not less than 2 atomic percent and not more than 30 atomic percent.

5. The device according to claim 1, wherein a portion of the recording layer close to a first interface between the recording layer and the first layer has a concentration of the main group element lower than a concentration of the main group element of a portion of the recording layer far to the first interface.

6. The device according to claim 5, wherein a region of the first layer close to the first interface between the recording layer and the first layer has a concentration of the main group element higher than a concentration of the main group element of a region of the first layer far to the first interface.

7. The device according to claim 5, wherein
   the first layer has a close region, an intermediate region, and a far region, the close region being closer to the first interface between the recording layer and the first layer than the intermediate region, the far region being farther to the first interface than the intermediate region,
   the close region has a concentration of the main group element higher than a concentration of the main group element of the intermediate region, and
   the far region has a concentration of the main group element higher than the concentration of the main group element of the intermediate region.

8. The device according to claim 1, further comprising a second layer made of at least one selected from a metal, a metal oxide, a metal nitride, and a metal carbide and provided adjacent to the recording layer on a side opposite to the first layer, the second layer including the main group element with a concentration lower than a concentration of the main group element of the recording layer.

9. The device according to claim 8, wherein a region of the second layer close to a second interface between the recording layer and the second layer has a concentration of the main group element higher than a concentration of the main group element of a region of the second layer far to the second interface.

10. The device according to claim 8, wherein
    the second layer has a close region, an intermediate region and a far region, the close region being closer to a second interface between the recording layer and the second layer than the intermediate region, the far region being farther to the second interface than the intermediate region,
    the close region has a concentration of the main group element higher than a concentration of the main group element of the intermediate region, and
    the far region has a concentration of the main group element higher than the concentration of the main group element of the intermediate region.

11. The device according to claim 10, wherein a portion of the recording layer close to a second interface between the recording layer and the second layer has a concentration of the main group element lower than a concentration of the main group element of a portion of the recording layer farther to the second interface.

12. The device according to claim 10, wherein
    the first layer has a closer region, an intermediate region, and a father region, the closer region being closer to the first interface between the recording layer and the first layer than the intermediate region, the farther region being farther to the first interface than the intermediate region,
    the closer region has a concentration of the main group element higher than a concentration of the main group element of the intermediate region, and
    the farther region has a concentration of the main group element higher than the concentration of the main group element of the intermediate region.

13. The device according to claim 12, wherein a portion of the recording layer closer to the first interface between the recording layer and the first layer has a concentration of the main group element lower than a concentration of the main group element of a portion of the recording layer farther to the first interface.

14. The device according to claim 8, wherein a portion of the recording layer close to a second interface between the recording layer and the second layer has a concentration of the main group element lower than a concentration of the main group element of a portion of the recording layer far to the second interface.

15. The device according to claim 14, wherein a region of the first layer close to a first interface between the recording layer and the first layer has a concentration of the main group element higher than a concentration of the main group element of a region of the first layer far to the first interface.

16. The device according to claim 14, wherein
the first layer has a close region, an intermediate region and far region, the close region being closer to the first interface between the recording layer and the first layer than the intermediate region, the far region being farther to the first interface than the intermediate region,
the close region has a concentration of the main group element higher than a concentration of the main group element of an intermediate region, and
the far region has a concentration of the main group element higher than the concentration of the main group element of the intermediate region.

17. The device according to claim 1, further comprising a second layer made of at least one selected from a metal, a metal oxide, a metal nitride, and a metal carbide and provided adjacent to the recording layer on a side opposite to the first layer,
one layer of the first layer and the second layer being provided with a lower potential than other layer of the first layer and the second layer,
a concentration of the main group element in the one layer being higher than a concentration of the main group element in the other layer.

18. The device according to claim 1, wherein the recording layer has one selected from a spinel structure represented by $A_xB_yO_4$ ($0.1 \leq x \leq 2.2$ and $1.5 \leq y \leq 2$), a delafossite structure represented by $A_xB_yO_2$ ($0.1 \leq x \leq 1.1$ and $0.9 \leq y \leq 1.1$), a wolframite structure represented by $A_xB_yO_4$ ($0.5 \leq x \leq 1.1$ and $0.7 \leq y \leq 1.1$), and an ilmenite structure represented by $A_xB_yO_3$ ($0.5 \leq x \leq 1.1$ and $0.9 \leq y \leq 1$), where A is the main group element and B is the transition element.

19. The device according to claim 18, wherein the main group element is at least one selected from the group consisting of Zn, Cd, and Hg.

20. The device according to claim 19, wherein the transition element is at least one selected from the group consisting of Cr and Mn.

21. The device according to claim 18, wherein the transition element is at least one selected from the group consisting of Cr and Mn.

22. A nonvolatile memory apparatus, comprising:
a nonvolatile memory device, including:
a recording layer including
a main group element,
a transition element, and
oxygen,
the recording layer being capable of recording information by changing reversibly between a high resistance state and a low resistance state; and
a conductive first layer made of at least one selected from a metal, a metal oxide, a metal nitride, and a metal carbide and provided adjacent to the recording layer, the first layer including the main group element with a concentration lower than a concentration of the main group element of the recording layer; and
a drive unit configured to record information by causing the recording layer to transition between the high resistance state and the low resistance state by at least one selected from applying a voltage to the recording layer of the nonvolatile memory device and causing a current to flow in the recording layer.

23. The apparatus according to claim 22, further comprising a word line and a bit line provided with the nonvolatile memory device interposed,
the drive unit being configured to perform the at least one selected from applying the voltage to the recording layer of the nonvolatile memory device and causing the current to flow in the recording layer via the word line and the bit line.

24. The apparatus according to claim 22, further comprising a probe provided together with the nonvolatile memory device,
the drive unit being configured to perform the at least one selected from applying the voltage and causing the current to flow for the recording layer of the nonvolatile memory device via the probe.

25. The apparatus according to claim 22, further comprising a MIS transistor including a gate electrode and a gate insulation layer, the nonvolatile memory device being provided between the gate electrode and the gate insulation layer,
the drive unit being configured to perform the at least one selected from applying the voltage to the recording layer of the nonvolatile memory device and causing the current to flow in the recording layer by the gate electrode.

26. The apparatus according to claim 22, further comprising:
a first second-conductivity type semiconductor region and a second second-conductivity type semiconductor region;
a first-conductivity type semiconductor region between the first second-conductivity type semiconductor region and the second second-conductivity type semiconductor region; and
a gate electrode configured to control a conduction between the first second-conductivity type semiconductor region and the second second-conductivity type semiconductor region,
the nonvolatile memory device being disposed between the gate electrode and the first-conductivity type semiconductor region,
the drive unit being configured to perform the at least one selected from applying the voltage to the recording layer of the nonvolatile memory device and causing the current to flow in the recording layer by the gate electrode.

* * * * *